United States Patent
Iben et al.

(10) Patent No.: US 11,181,602 B2
(45) Date of Patent: Nov. 23, 2021

(54) DETECTING DAMAGED TMR SENSORS USING BIAS CURRENTS AND OUTLIERS

(71) Applicant: International Business Machines Corporation, Armonk, NY (US)

(72) Inventors: Icko E. T. Iben, Santa Clara, CA (US); Guillermo Francisco Paniagua, Milpitas, CA (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 16/436,462

(22) Filed: Jun. 10, 2019

(65) Prior Publication Data

US 2020/0386841 A1    Dec. 10, 2020

(51) Int. Cl.
*G01R 35/00* (2006.01)
*G01R 33/09* (2006.01)
(Continued)

(52) U.S. Cl.
CPC ........... *G01R 35/00* (2013.01); *G01R 33/091* (2013.01); *G01R 33/098* (2013.01);
(Continued)

(58) Field of Classification Search
CPC .. G01R 35/00; G01R 33/098; G01R 31/2894; G01R 33/091; G01R 33/1207;
(Continued)

(56) References Cited

U.S. PATENT DOCUMENTS 6,600,638 B2   7/2003   Gill
7,656,602 B2   2/2010   Iben et al.
(Continued)

FOREIGN PATENT DOCUMENTS

EP   1134743 A2   9/2001
EP   2363722 A1   9/2011

OTHER PUBLICATIONS

Deak, J., "Practical Tunneling Magnetoresistive Z-Axis Sensors," AMA Conferences, 2015, pp. 245-250.
(Continued)

*Primary Examiner* — Judy Nguyen
*Assistant Examiner* — Joseph O Nyamogo
(74) *Attorney, Agent, or Firm* — Zilka-Kotab, P.C.

(57) ABSTRACT

A computer-implemented method to detect a damaged tunneling magnetoresistance (TMR) sensor includes applying current at at least two different current values to the TMR sensor and measuring a resistance, $R_{TMR}$, at each current value. The method also includes measuring a slope in resistance vs. bias current, $RD_{SLP}$, using the measured resistances $R_{TMR}$ and the at least two different current values. The method includes calculating a $\Delta RD_{SLP}$ value as a difference between the $RD_{SLP}$ value and an expected value, $RD_{SLP\text{-}expected}$, for the TMR sensor. The method includes determining whether the $\Delta RD_{SLP}$ value is within a predefined range. In response to determining that the $\Delta RD_{SLP}$ value is outside the predefined range, the method includes outputting an indication that the TMR sensor fails. In response to determining that the $\Delta RD_{SLP}$ value is within the predefined range, the method includes outputting an indication that the TMR sensor passes.

18 Claims, 13 Drawing Sheets

(51) Int. Cl.
  *G11B 5/39* (2006.01)
  *G01R 31/28* (2006.01)
  *G01R 33/12* (2006.01)
  *G11B 5/00* (2006.01)
  *G11B 5/008* (2006.01)
  *G11B 5/455* (2006.01)

(52) U.S. Cl.
  CPC ........ *G01R 33/1207* (2013.01); *G11B 5/3909* (2013.01); *G11B 5/455* (2013.01); *G01R 31/2894* (2013.01); *G11B 5/00817* (2013.01); *G11B 2005/0018* (2013.01)

(58) Field of Classification Search
  CPC .......... G11B 5/3909; G11B 2005/0018; G11B 5/00817; G11B 5/455
  See application file for complete search history.

(56) References Cited

U.S. PATENT DOCUMENTS

| | | |
|---|---|---|
| 8,743,511 B2 | 6/2014 | Childress et al. |
| 9,251,810 B2 | 2/2016 | Iben |
| 9,620,154 B1 | 4/2017 | Iben |
| 9,678,145 B2 | 6/2017 | Iben |
| 9,685,201 B2 | 6/2017 | Iben et al. |
| 10,311,902 B2 | 6/2019 | Aria et al. |
| 2006/0279882 A1 | 12/2006 | Honda et al. |
| 2016/0093320 A1* | 3/2016 | Aria ................ G11B 5/3909 369/53.38 |
| 2017/0125040 A1 | 5/2017 | Ahmad et al. |
| 2017/0284966 A1 | 10/2017 | Kosel et al. |
| 2017/0370984 A1 | 12/2017 | Biskeborn et al. |

OTHER PUBLICATIONS

Jander, et al., "Magnetoresistive Sensors for Nondestructive Evaluation," 10th SPIE International Symposium, Nondestructive Evaluation for Health Monitoring and Diagnostics, Conference 5770, 2005, 13 pages.

Biskeborn et al., "Head and Interface for High Areal Density Tape Recording," IEEE Transactions on Magnetics, vol. 48, No. 11, Nov. 2012, pp. 4463-4466.

Eric et al., "Dielectric Breakdown of TMR Sensors and the Role of Joule Heating," 38th Electrical Overstress/Electrostatic Discharge Symposium (EOS/ESD), 2016, 9 pages, retrieved from https://ieeexplore.ieee.org/document/7592529.

Iben et al., U.S. Appl. No. 16/506,880, filed Jul. 9, 2019.

* cited by examiner

DETECTING DAMAGED TMR SENSORS USING BIAS CURRENTS AND OUTLIERS

BACKGROUND

The present invention relates to data storage systems, and more particularly, this invention relates to detecting damaged TMR sensors.

In magnetic storage systems, magnetic transducers read data from and write data onto magnetic recording media. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has led to increasing the track and linear bit density on recording tape, and decreasing the thickness of the magnetic tape medium. However, the development of small footprint, higher performance tape drive systems has created various challenges ranging from the design of tape head assemblies for use in such systems to dealing with tape dimensional instability.

Tunneling magnetoresistive (TMR) sensors are used to read magnetic data written on storage media such as hard disks, high definition (HD) media, tape media, etc. TMR sensors comprise two ferromagnetic layers separated by a thin oxide tunnel barrier (e.g., MgO or AlO). The polarization direction of one of the ferromagnetic layers is "pinned" to a particular direction while the polarization direction of the other ferromagnetic layer (e.g., the free layer) is free to align with the polarization direction of magnetic storage media over which the TMR sensor is passed. When the polarization directions of the free layer and the pinned layer are parallel, the electrical resistance across the TMR sensor is low because the electrons tunnel through the tunnel barrier. When the polarization of the free layer and the pinned layer are anti-parallel, the electrical resistance across the TMR sensor is high because electrons may not tunnel through the tunnel barrier. TMR sensors read bits stored on magnetic storage media by measuring changes in resistance across the TMR sensor due to the magnetic fields generated by the bit transitions as the sensor passes over those bits.

TMR sensors may be damaged by scratches, dielectric breakdown from electrical overstress (EOS), dielectric breakdown from electrical discharge (ESD), pin-holes, lapping smears resulting in degraded and/or abnormal amplitude response of a TMR sensors, etc. Damage to a TMR sensor may be difficult to detect using magnetic tests which detect damage by degraded and/or abnormal magnetoresistance (MR) response from a magnetic field. Subjecting TMR sensors to magnetic fields in the manufacturing line is often not practical.

SUMMARY

A computer-implemented method to detect a damaged tunneling magnetoresistance (TMR) sensor, according to one embodiment, includes applying current at at least two different current values to the TMR sensor and measuring a resistance, $R_{TMR}$, at each current value. The method also includes measuring a slope in resistance vs. bias current, $RD_{SLP}$, using the measured resistances $R_{TMR}$ and the at least two different current values. The method includes calculating a $\Delta RD_{SLP}$ value as a difference between the $RD_{SLP}$ value and an expected value, $RD_{SLP\text{-}expected}$, for the TMR sensor. $RD_{SLP\text{-}expected}$ is not the same value for all TMRs in a plurality of TMR sensors for a product. The method includes determining whether the $\Delta RD_{SLP}$ value is within a predefined range. In response to determining that the $\Delta RD_{SLP}$ value is outside the predefined range, the method includes outputting an indication that the TMR sensor fails. In response to determining that the $\Delta RD_{SLP}$ value is within the predefined range, the method includes outputting an indication that the TMR sensor passes.

A computer program product to detect damaged tunneling magnetoresistance (TMR) sensors, according to one embodiment, includes a computer readable storage medium having program instructions embodied therewith. The program instructions executable by a computer to cause the computer to apply, by the computer, a first current, $I_1$, and a second current, $I_2$, to each of n TMR sensors located on a common substrate and built simultaneously and measure, by the computer, for each of the TMR sensors, resistances $R_{TMR}$ ($I_m$) for m=1 and m=2. The program instructions cause the computer to calculate, by the computer, a slope in resistance vs. bias current, $RD_{SLPn}$, using the measured resistances $R_{TMR}$ ($I_m$) and the current values for $I_1$ and $I_2$, for each of the TMR sensors. The program instructions cause the computer to calculate, by the computer, the median $RD_{SLPn}$ for the TMR sensors located on the common substrate, $RD_{SLP\text{-}median}$. The program instructions cause the computer to calculate, by the computer, residuals of the nth element, $\Delta RD_{SLP\text{-}n}$, where $\Delta RD_{SLP\text{-}n} = RD_{SLPn} - RD_{SLP\text{-}median}$ and determine, by the computer, whether the $\Delta RD_{SLP\text{-}n}$ value is within a predefined range. In response to determining that the $\Delta RD_{SLP\text{-}n}$ value is outside the predefined range, the program instructions cause the computer to output an indication that the TMR sensor fails. In response to determining that the $\Delta RD_{SLP\text{-}n}$ value is within the predefined range, the program instructions cause the computer to output an indication that the TMR sensor passes.

A computer-implemented method to use a current-based tester as a pseudo voltage-based tester, according to one embodiment, includes setting a target voltage, $V_{target}$, for a tunneling magnetoresistance (TMR) sensor using a current-based tester and selecting a current value, $I_{bias}$, where $I_{bias} = V_{target}/R_{TMR\text{-}expected}$. $R_{TMR\text{-}expected}$ is an expected resistance for the TMR sensor. The method includes applying a current at the value, $I_{bias}$, to the TMR sensor and measuring a resistance across the TMR sensor, $R_{TMR}$. The method also includes calculating a bias voltage, $V_{bias}$, using the current value, $I_{bias}$, and the measured resistance, where $V_{bias} = I_{bias} \cdot R_{TMR}$, and comparing the calculated bias voltage to the target voltage. The method includes storing the current value, $I_{bias}$, in response to determining that the bias voltage is within a predefined range of the target voltage.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

DETAILED DESCRIPTION

Figure 1A:
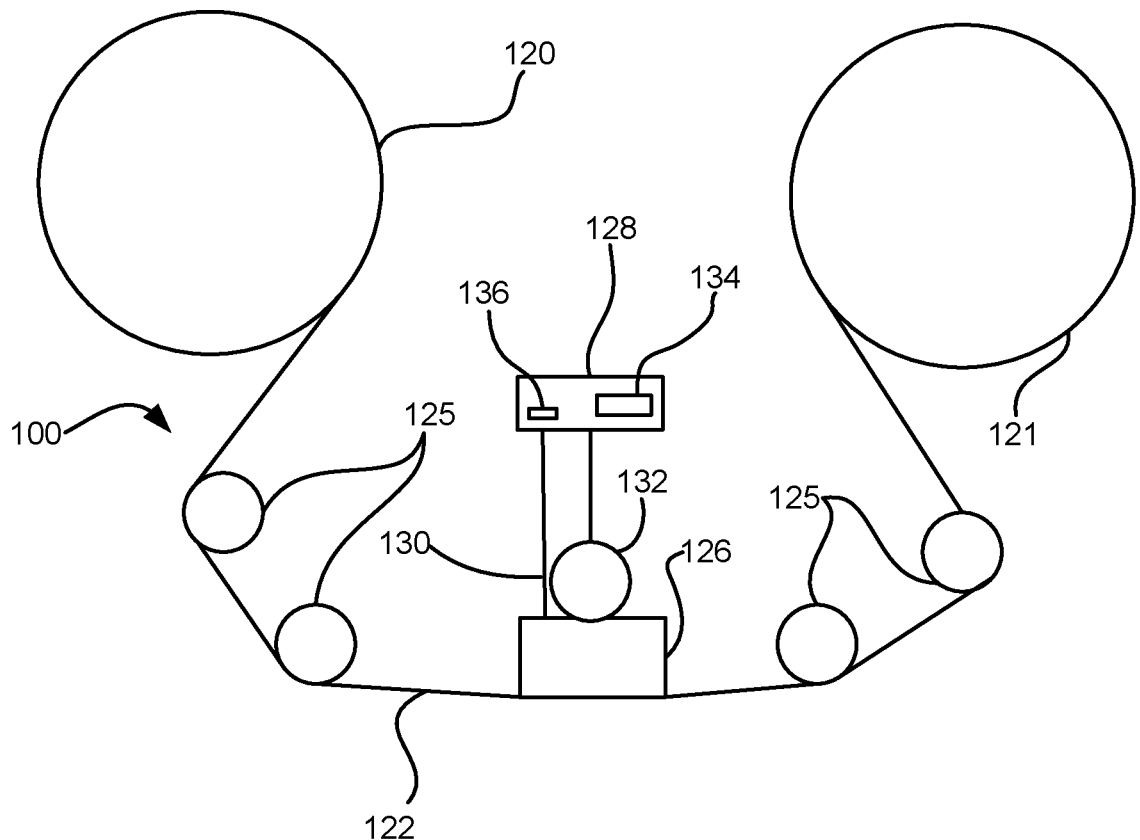
FIG. 1A is a schematic diagram of a simplified tape drive system according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof.

In one general embodiment, a computer-implemented method to detect a damaged tunneling magnetoresistance (TMR) sensor includes applying current at at least two different current values to the TMR sensor and measuring a resistance, $R_{TMR}$, at each current value. The method also includes measuring a slope in resistance vs. bias current, $RD_{SLP}$, using the measured resistances $R_{TMR}$ and the at least two different current values. The method includes calculating a $\Delta RD_{SLP}$ value as a difference between the $RD_{SLP}$ value and an expected value, $RD_{SLP-expected}$, for the TMR sensor. $RD_{SLP-expected}$ is not the same value for all TMRs in a plurality of TMR sensors for a product. The method includes determining whether the $\Delta RD_{SLP}$ value is within a predefined range. In response to determining that the $\Delta RD_{SLP}$ value is outside the predefined range, the method includes outputting an indication that the TMR sensor fails. In response to determining that the $\Delta RD_{SLP}$ value is within the predefined range, the method includes outputting an indication that the TMR sensor passes.

In another general embodiment, a computer program product to detect damaged tunneling magnetoresistance (TMR) sensors includes a computer readable storage medium having program instructions embodied therewith. The program instructions executable by a computer to cause the computer to apply, by the computer, a first current, $I_1$, and a second current, $I_2$, to each of n TMR sensors located on a common substrate and built simultaneously and measure, by the computer, for each of the TMR sensors, resistances $R_{TMR}(I_m)$ for m=1 and m=2. The program instructions cause the computer to calculate, by the computer, a slope in resistance vs. bias current, $RD_{SLPn}$, using the measured resistances $R_{TMR}(I_m)$ and the current values for $I_1$ and $I_2$, for each of the TMR sensors. The program instructions cause the computer to calculate, by the computer, the median $RD_{SLPn}$ for the TMR sensors located on the common substrate, $RD_{SLP-median}$. The program instructions cause the computer to calculate, by the computer, residuals of the nth element, $\Delta RD_{SLP-n}$, where $\Delta RD_{SLP-n}=RD_{SLPn}-RD_{SLP-median}$ and determine, by the computer, whether the $\Delta RD_{SLP-n}$ value is within a predefined range. In response to determining that the $\Delta RD_{SLP-n}$ value is outside the predefined range, the program instructions cause the computer to output an indication that the TMR sensor fails. In response to determining that the $\Delta RD_{SLP-n}$ value is within the predefined range, the program instructions cause the computer to output an indication that the TMR sensor passes.

In another general embodiment, a computer-implemented method to use a current-based tester as a pseudo voltage-based tester includes setting a target voltage, $V_{target}$, for a tunneling magnetoresistance (TMR) sensor using a current-based tester and selecting a current value, $I_{bias}$, where $I_{bias}=V_{target}/R_{TMR-expected}$. $R_{TMR-expected}$ is an expected resistance for the TMR sensor. The method includes applying a current at the value, $I_{bias}$, to the TMR sensor and measuring a resistance across the TMR sensor, $R_{TMR}$. The method also includes calculating a bias voltage, $V_{bias}$, using the current value, $I_{bias}$, and the measured resistance, where $V_{bias}=I_{bias} \cdot R_{TMR}$, and comparing the calculated bias voltage to the target voltage. The method includes storing the current value, $I_{bias}$, in response to determining that the bias voltage is within a predefined range of the target voltage.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the tape drive 100. The tape drive, such as that illustrated in FIG. 1A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the tape head 126 to be recorded on the tape 122 and to receive data read by the tape head 126 from the tape 122. An actuator 132 controls position of the tape head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 1B:
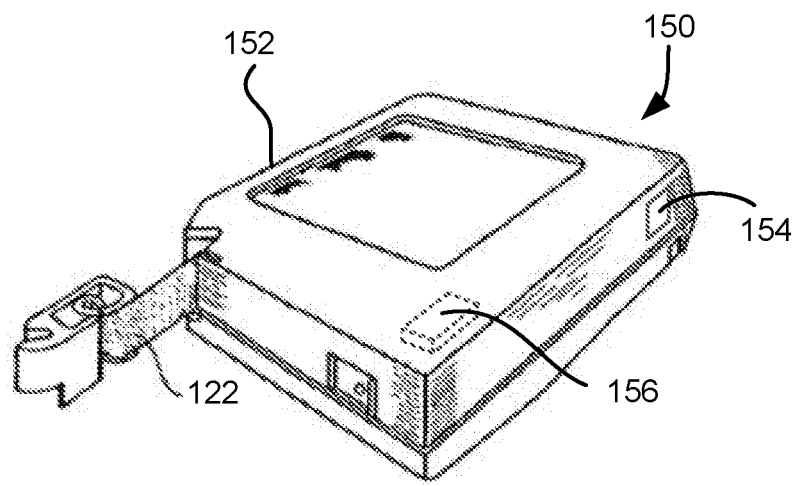
FIG. 1B is a schematic diagram of a tape cartridge according to one embodiment.

FIG. 1B illustrates an exemplary tape cartridge 150 according to one embodiment. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 1B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, read-only memory (ROM) device, etc., embedded into or coupled to the inside or outside of the tape cartridge 150. The nonvolatile memory is accessible by the tape drive and the tape operating software (the driver software), and/or another device.

Figure 2A:
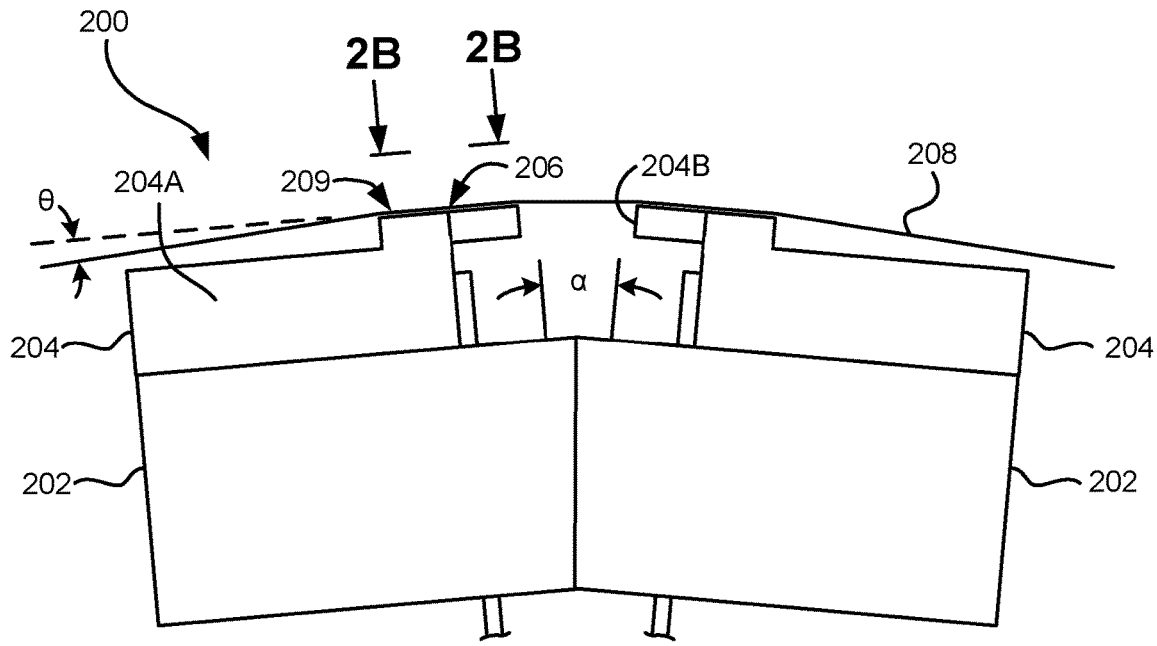
FIG. 2A illustrates a side view of a flat-lapped, bi-directional, two-module magnetic tape head according to one embodiment.

By way of example, FIG. 2A illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between about 0.1 degree and about 3 degrees.

The substrates 204A are typically constructed of a wear resistant material, such as a ceramic. The closures 204B may be made of the same or similar ceramic as the substrates 204A.

The readers and writers may be arranged in a piggyback or merged configuration. An illustrative piggybacked configuration comprises a (magnetically inductive) writer transducer on top of (or below) a (magnetically shielded) reader transducer (e.g., a magnetoresistive reader, etc.), wherein the poles of the writer and the shields of the reader are generally separated. An illustrative merged configuration comprises one reader shield in the same physical layer as one writer pole (hence, "merged"). The readers and writers may also be arranged in an interleaved configuration. Alternatively, each array of channels may be readers or writers only. Any of these arrays may contain one or more servo track readers for reading servo data on the medium.

Figure 2B:
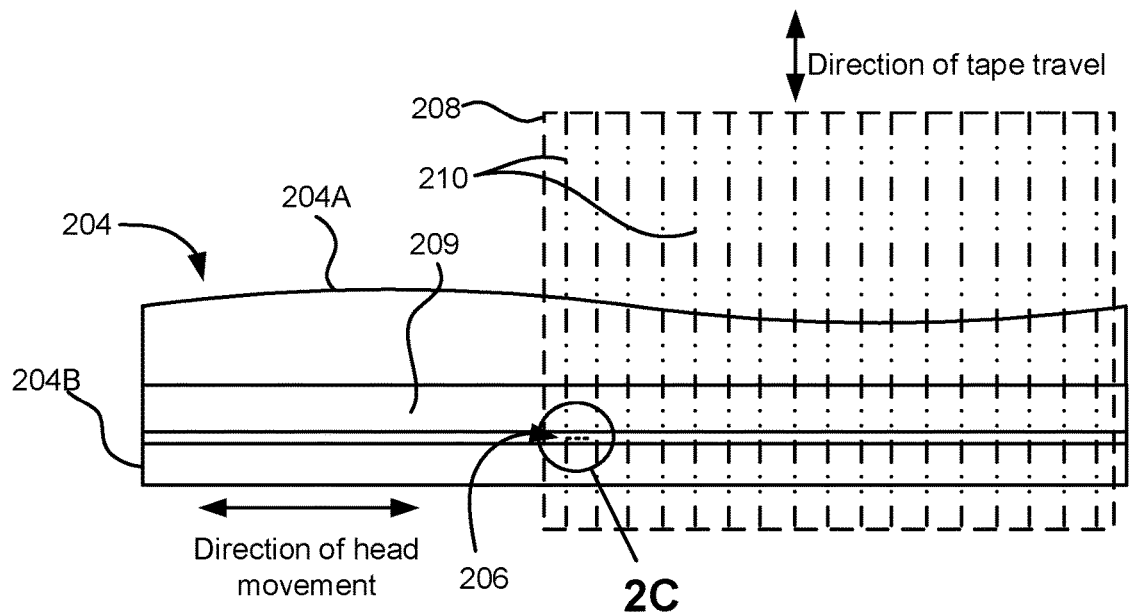
FIG. 2B is a tape bearing surface view taken from Line 2B of FIG. 2A.

FIG. 2B illustrates the tape bearing surface 209 of one of the modules 204 taken from Line 2B of FIG. 2A. A representative tape 208 is shown in dashed lines. The module 204 is preferably long enough to be able to support the tape as the head steps between data bands.

In this example, the tape 208 includes 4 to 32 data bands, e.g., with 16 data bands and 17 servo tracks 210, as shown in FIG. 2B on a one-half inch wide tape 208. The data bands are defined between servo tracks 210. Each data band may include a number of data tracks, for example 1024 data tracks (not shown). During read/write operations, the readers and/or writers 206 are positioned to specific track positions within one of the data bands. Outer readers, sometimes called servo readers, read the servo tracks 210. The servo signals are in turn used to keep the readers and/or writers 206 aligned with a particular set of tracks during the read/write operations.

Figure 2C:
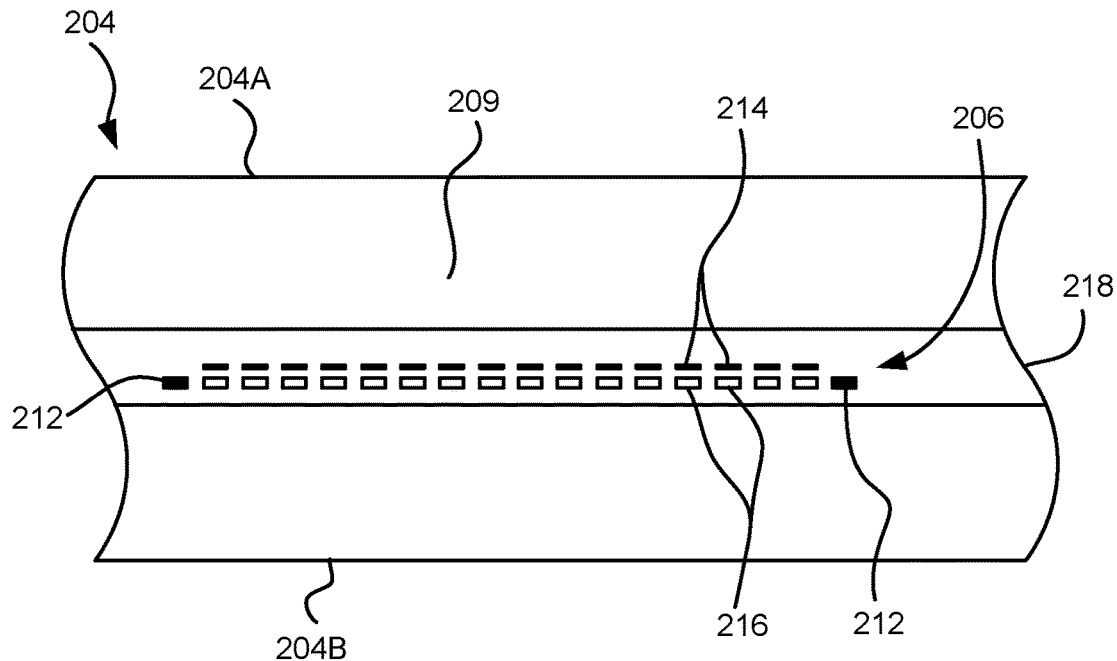
FIG. 2C is a detailed view taken from Circle 2C of FIG. 2B.

FIG. 2C depicts a plurality of readers and/or writers 206 formed in a gap 218 on the module 204 in Circle 2C of FIG. 2B. As shown, the array of readers and writers 206 includes, for example, 16 writers 214, 16 readers 216 and two servo readers 212, though the number of elements may vary. Illustrative embodiments include 8, 16, 32, 40, and 64 active readers and/or writers 206 per array, and alternatively interleaved designs having odd numbers of reader or writers such as 17, 25, 33, etc. An illustrative embodiment includes 32 readers per array and/or 32 writers per array, where the actual number of transducer elements could be greater, e.g., 33, 34, etc. This allows the tape to travel more slowly, thereby reducing speed-induced tracking and mechanical difficulties and/or execute fewer "wraps" to fill or read the tape. While the readers and writers may be arranged in a piggyback configuration as shown in FIG. 2C, the readers 216 and writers 214 may also be arranged in an interleaved configuration. Alternatively, each array of readers and/or writers 206 may be readers or writers only, and the arrays may contain one or more servo readers 212. As noted by considering FIGS. 2A and 2B-2C together, each module 204 may include a complementary set of readers and/or writers 206 for such things as bi-directional reading and writing, read-while-write capability, backward compatibility, etc.

Figure 2D:
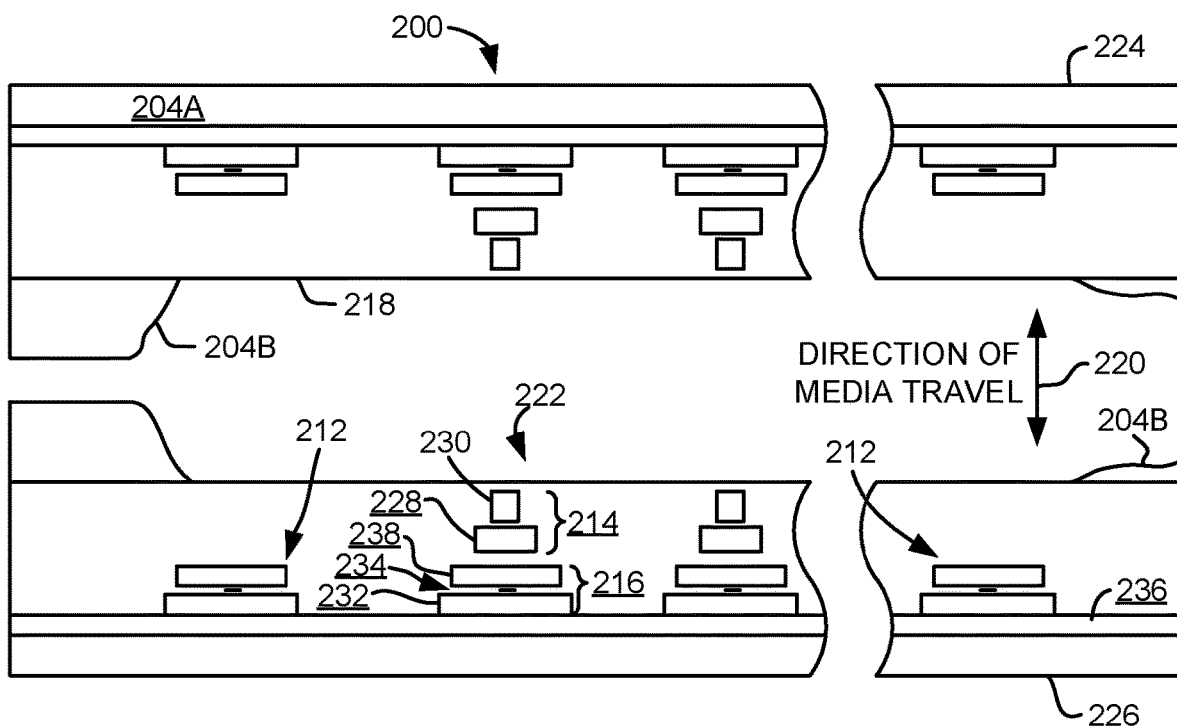
FIG. 2D is a detailed view of a partial tape bearing surface of a pair of modules.

FIG. 2D shows a partial tape bearing surface view of complementary modules of a magnetic tape head 200 according to one embodiment. In this embodiment, each module has a plurality of read/write (R/W) pairs in a piggyback configuration formed on a common substrate 204A and an optional electrically insulative insulating layer 236. The writers 214 and the readers 216 are aligned parallel to an intended direction of travel of a tape medium thereacross to form an R/W pair, exemplified by R/W pairs 222. Note that the intended direction of tape travel is sometimes referred to herein as the direction of tape travel, and such terms may be used interchangeably. Such direction of tape travel may be inferred from the design of the system, e.g., by examining the guides; observing the actual direction of tape travel relative to the reference point; etc. Moreover, in a system operable for bi-direction reading and/or writing, the direction of tape travel in both directions is typically parallel and thus both directions may be considered equivalent to each other.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a magnetic tape head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (-), cobalt zirconium tantalum (CZT) or Al—Fe—Si (Sendust), a sensor 234 for sensing a data track on a magnetic medium, a second shield 238 typically of a nickel-iron alloy (e.g., ~80/20 at % NiFe, also known as permalloy), first and second writer poles 228, 230, and a coil (not shown). The sensor may be of any known type, including those based on magnetoresistive (MR), GMR, AMR, tunneling magnetoresistance (TMR), etc. The first and second writer poles 228, 230 may be fabricated from high magnetic moment materials such as ~45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Figure 4:
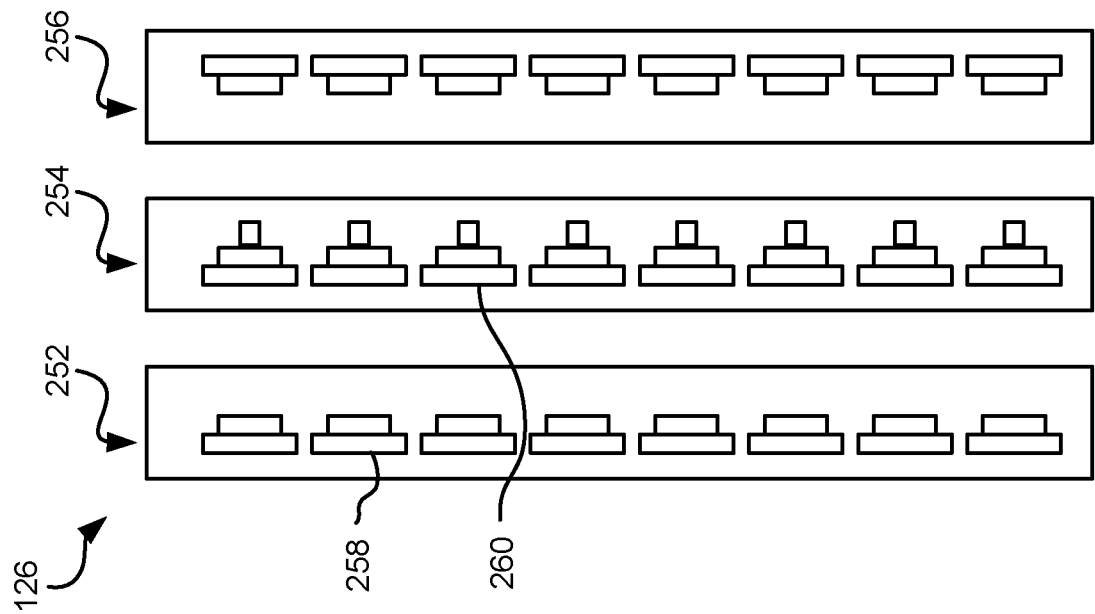
FIG. 4 is a partial tape bearing surface view of a magnetic head having a read-write-read configuration.
Figure 3:
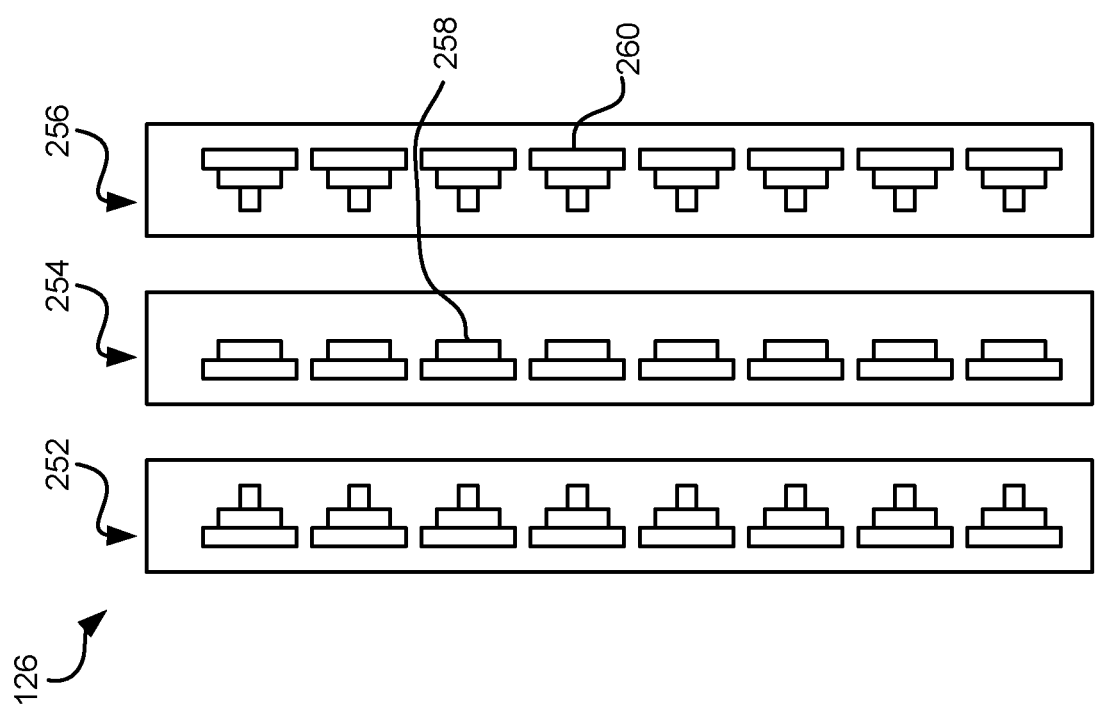
FIG. 3 is a partial tape bearing surface view of a magnetic head having a write-read-write configuration.

The configuration of the tape head 126 according to one embodiment includes multiple modules, preferably three or more. In a write-read-write (W-R-W) head, outer modules for writing flank one or more inner modules for reading. Referring to FIG. 3, depicting a W-R-W configuration, the outer modules 252, 256 each include one or more arrays of writers 260. The inner module 254 of FIG. 3 includes one or more arrays of readers 258 in a similar configuration. Variations of a multi-module head include a R-W-R head (FIG. 4), a R-R-W head, a W-W-R head, etc. In yet other variations, one or more of the modules may have read/write pairs of transducers. Moreover, more than three modules may be present. In further approaches, two outer modules may flank two or more inner modules, e.g., in a W-R-R-W, a R-W-W-R arrangement, etc. For simplicity, a W-R-W head is used primarily herein to exemplify embodiments of the present invention. One skilled in the art apprised with the teachings herein will appreciate how permutations of the present invention would apply to configurations other than a W-R-W configuration.

Figure 5:
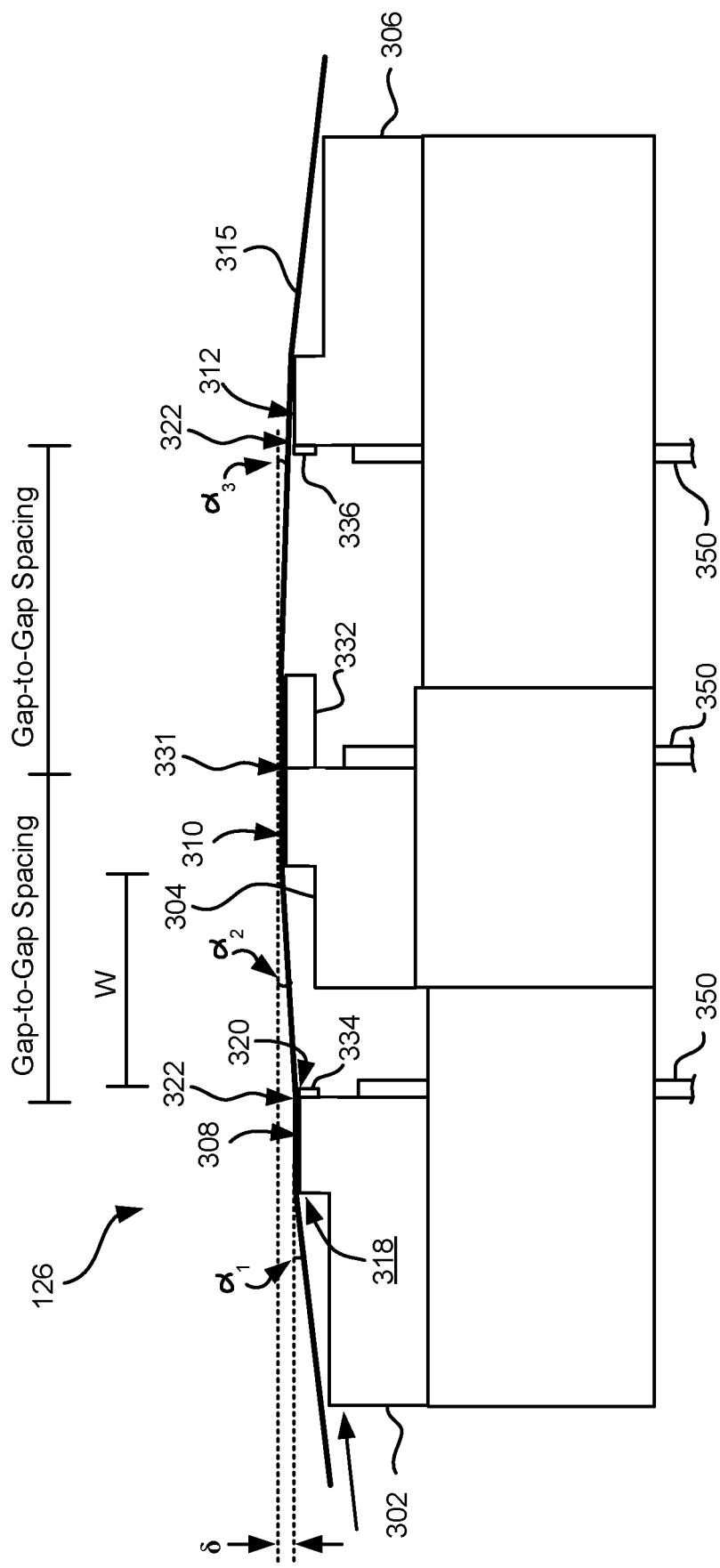
FIG. 5 is a side view of a magnetic tape head with three modules according to one embodiment where the modules all generally lie along about parallel planes.

FIG. 5 illustrates a magnetic head 126 according to one embodiment of the present invention that includes first, second and third modules 302, 304, 306 each having a tape bearing surface 308, 310, 312 respectively, which may be flat, contoured, etc. Note that while the term "tape bearing surface" appears to imply that the surface facing the tape 315 is in physical contact with the tape bearing surface, this is not necessarily the case. Rather, only a portion of the tape may be in contact with the tape bearing surface, constantly or intermittently, with other portions of the tape riding (or "flying") above the tape bearing surface on a layer of air, sometimes referred to as an "air bearing". The first module 302 will be referred to as the "leading" module as it is the first module encountered by the tape in a three module design for tape moving in the indicated direction. The third module 306 will be referred to as the "trailing" module. The trailing module follows the middle module and is the last module seen by the tape in a three module design. The leading and trailing modules 302, 306 are referred to collectively as outer modules. Also note that the outer modules 302, 306 will alternate as leading modules, depending on the direction of travel of the tape 315.

Figure 6:
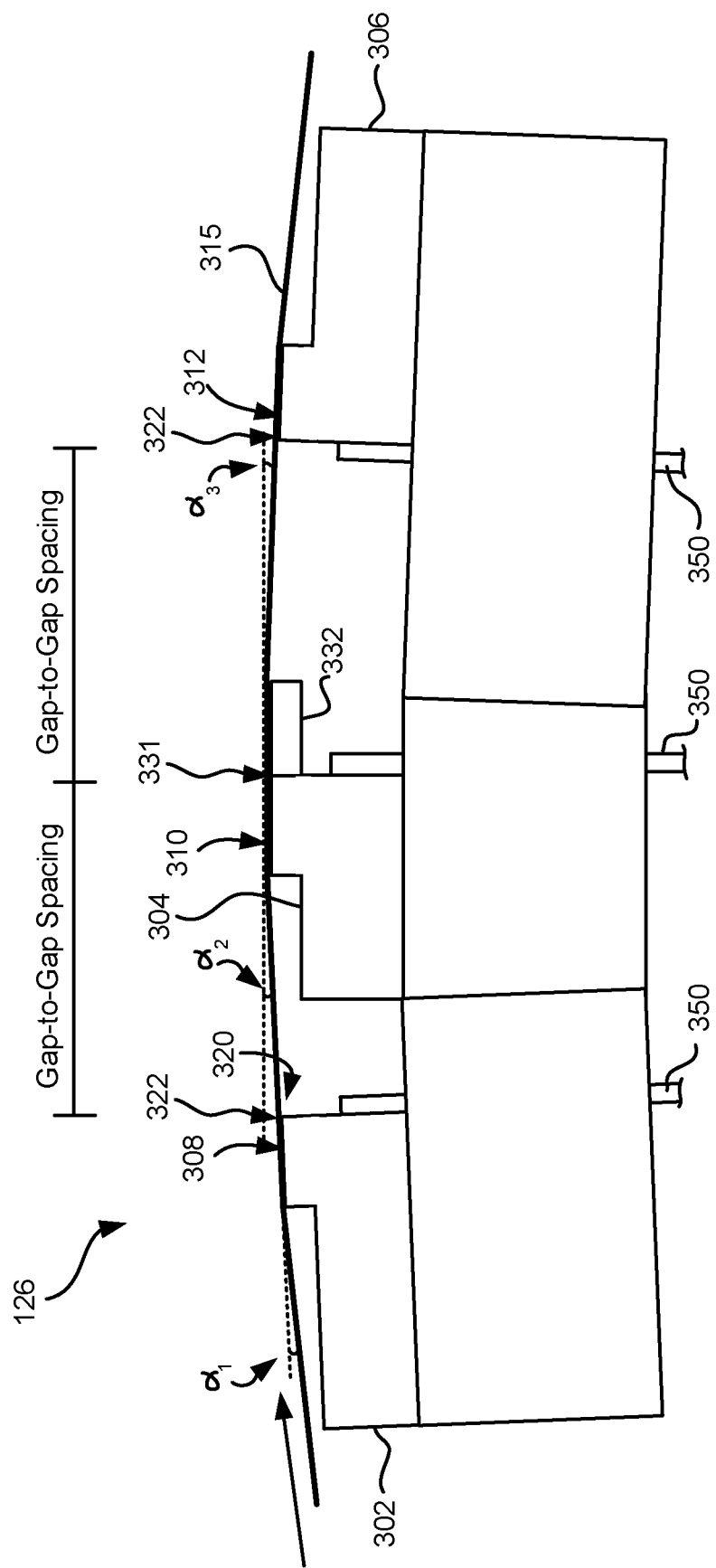
FIG. 6 is a side view of a magnetic tape head with three modules in a tangent (angled) configuration.

In one embodiment, the tape bearing surfaces 308, 310, 312 of the first, second and third modules 302, 304, 306 lie on about parallel planes (which is meant to include parallel and nearly parallel planes, e.g., between parallel and tangential as in FIG. 6), and the tape bearing surface 310 of the second module 304 is above the tape bearing surfaces 308, 312 of the first and third modules 302, 306. As described below, this has the effect of creating the desired wrap angle $\alpha_2$ of the tape relative to the tape bearing surface 310 of the second module 304.

Where the tape bearing surfaces 308, 310, 312 lie along parallel or nearly parallel yet offset planes, intuitively, the tape should peel off of the tape bearing surface 308 of the leading module 302. However, the vacuum created by a skiving edge 318 of the leading module 302 has been found by experimentation to be sufficient to keep the tape adhered to the tape bearing surface 308 of the leading module 302. A trailing edge 320 of the leading module 302 (the end from which the tape leaves the leading module 302) is the approximate reference point which defines the wrap angle $\alpha_2$ over the tape bearing surface 310 of the second module 304. The tape stays in close proximity to the tape bearing surface until close to the trailing edge 320 of the leading module 302. Accordingly, transducers 322 may be located near the trailing edges of the outer modules 302, 306. These embodiments are particularly adapted for write-read-write applications.

A benefit of this and other embodiments described herein is that, because the outer modules 302, 306 are fixed at a determined offset from the second module 304, the inner wrap angle $\alpha_2$ is fixed when the modules 302, 304, 306 are coupled together or are otherwise fixed into a head. The inner wrap angle $\alpha_2$ is approximately $\tan^{-1}(\delta/W)$ where $\delta$ is the height difference between the planes of the tape bearing surfaces 308, 310 and W is the width between the opposing ends of the tape bearing surfaces 308, 310. An illustrative inner wrap angle $\alpha_2$ is in a range of about 0.3° to about 1.1°, though can be any angle required by the design.

Beneficially, the inner wrap angle $\alpha_2$ on the side of the module 304 receiving the tape (leading edge) will be larger than the inner wrap angle $\alpha 3$ on the trailing edge, as the tape 315 rides above the trailing module 306. This difference is generally beneficial as a smaller $\alpha_3$ tends to oppose what has heretofore been a steeper exiting effective wrap angle.

Note that the tape bearing surfaces 308, 312 of the outer modules 302, 306 are positioned to achieve a negative wrap angle at the trailing edge 320 of the leading module 302. This is generally beneficial in helping to reduce friction due to contact with the trailing edge 320, provided that proper consideration is given to the location of the crowbar region that forms in the tape where it peels off the head. This negative wrap angle also reduces flutter and scrubbing damage to the elements on the leading module 302. Further, at the trailing module 306, the tape 315 flies over the tape bearing surface 312 so there is virtually no wear on the elements when tape is moving in this direction. Particularly, the tape 315 entrains air and so will not significantly ride on the tape bearing surface 312 of the third module 306 (some contact may occur). This is permissible, because the leading module 302 is writing while the trailing module 306 is idle.

Writing and reading functions are performed by different modules at any given time. In one embodiment, the second module 304 includes a plurality of data and optional servo readers 331 and no writers. The first and third modules 302, 306 include a plurality of writers 322 and no data readers, with the exception that the outer modules 302, 306 may include optional servo readers. The servo readers may be used to position the head during reading and/or writing operations. The servo reader(s) on each module are typically located towards the end of the array of readers or writers.

By having only readers or side by side writers and servo readers in the gap between the substrate and closure, the gap length can be substantially reduced. Typical heads have piggybacked readers and writers, where the writer is formed above each reader. A typical gap is 20-35 microns. However, irregularities on the tape may tend to droop into the gap and create gap erosion. Thus, the smaller the gap is the better. The smaller gap enabled herein exhibits fewer wear related problems.

In some embodiments, the second module 304 has a closure, while the first and third modules 302, 306 do not have a closure. Where there is no closure, preferably a hard coating is added to the module. One preferred coating is diamond-like carbon (DLC).

In the embodiment shown in FIG. 5, the first, second, and third modules 302, 304, 306 each have a closure 332, 334, 336, which extends the tape bearing surface of the associated module, thereby effectively positioning the read/write elements away from the edge of the tape bearing surface. The closure 332 on the second module 304 can be a ceramic closure of a type typically found on tape heads. The closures 334, 336 of the first and third modules 302, 306, however, may be shorter than the closure 332 of the second module 304 as measured parallel to a direction of tape travel over the respective module. This enables positioning the modules closer together. One way to produce shorter closures 334, 336 is to lap the standard ceramic closures of the second module 304 an additional amount. Another way is to plate or deposit thin film closures above the elements during thin film processing. For example, a thin film closure of a hard material such as Sendust or nickel-iron alloy (e.g., 45/55) can be formed on the module.

With reduced-thickness ceramic or thin film closures 334, 336 or no closures on the outer modules 302, 306, the write-to-read gap spacing can be reduced to less than about 1 mm, e.g., about 0.75 mm, or 50% less than commonly-used linear tape open (LTO) tape head spacing. The open space between the modules 302, 304, 306 can still be set to approximately 0.5 to 0.6 mm, which in some embodiments is ideal for stabilizing tape motion over the second module 304.

Depending on tape tension and stiffness, it may be desirable to angle the tape bearing surfaces of the outer modules relative to the tape bearing surface of the second module. FIG. 6 illustrates an embodiment where the modules 302, 304, 306 are in a tangent or nearly tangent (angled) configuration. Particularly, the tape bearing surfaces of the outer modules 302, 306 are about parallel to the tape at the desired wrap angle $\alpha_2$ of the second module 304. In other words, the planes of the tape bearing surfaces 308, 312 of the outer modules 302, 306 are oriented at about the desired wrap angle $\alpha_2$ of the tape 315 relative to the second module 304. The tape will also pop off of the trailing module 306 in this embodiment, thereby reducing wear on the elements in the trailing module 306. These embodiments are particularly useful for write-read-write applications. Additional aspects of these embodiments are similar to those given above.

Typically, the tape wrap angles may be set about midway between the embodiments shown in FIGS. 5 and 6.

Figure 7:
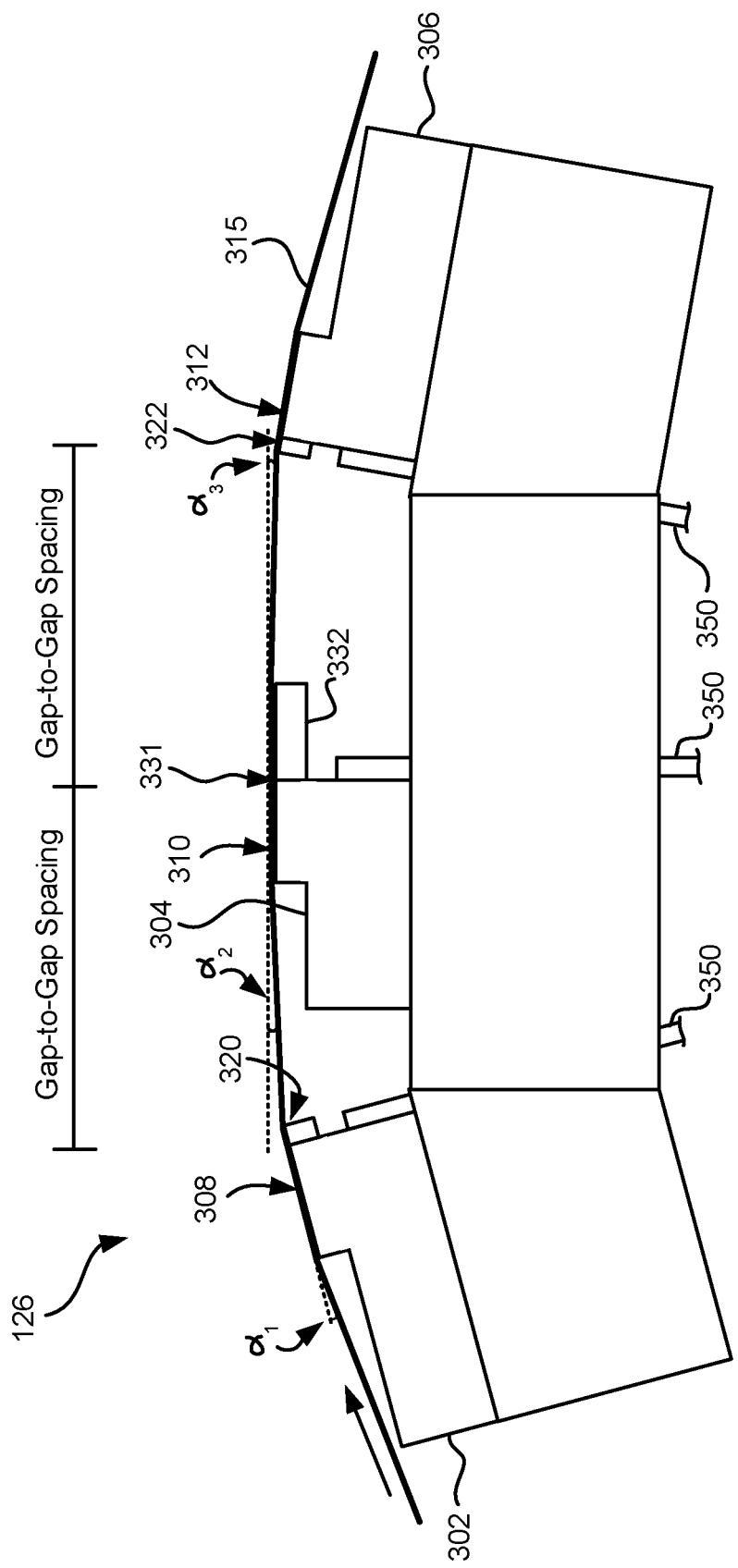
FIG. 7 is a side view of a magnetic tape head with three modules in an overwrap configuration.

FIG. 7 illustrates an embodiment where the modules 302, 304, 306 are in an overwrap configuration. Particularly, the tape bearing surfaces 308, 312 of the outer modules 302, 306 are angled slightly more than the tape 315 when set at the desired wrap angle $\alpha_2$ relative to the second module 304. In this embodiment, the tape does not pop off of the trailing module, allowing it to be used for writing or reading. Accordingly, the leading and middle modules can both perform reading and/or writing functions while the trailing module can read any just-written data. Thus, these embodiments are preferred for write-read-write, read-write-read, and write-write-read applications. In the latter embodiments, closures should be wider than the tape canopies for ensuring read capability. The wider closures may require a wider gap-to-gap separation. Therefore, a preferred embodiment has a write-read-write configuration, which may use shortened closures that thus allow closer gap-to-gap separation.

Additional aspects of the embodiments shown in FIGS. 6 and 7 are similar to those given above.

A 32 channel version of a multi-module tape head 126 may use cables 350 having leads on the same or smaller pitch as current 16 channel piggyback LTO modules, or alternatively the connections on the module may be organ-keyboarded for a 50% reduction in cable span. Over-under, writing pair unshielded cables may be used for the writers, which may have integrated servo readers.

The outer wrap angles $\alpha_1$ may be set in the drive, such as by guides of any type known in the art, such as adjustable rollers, slides, etc. or alternatively by outriggers, which are integral to the head. For example, rollers having an offset axis may be used to set the wrap angles. The offset axis creates an orbital arc of rotation, allowing precise alignment of the wrap angle $\alpha_1$.

To assemble any of the embodiments described above, conventional u-beam assembly can be used. Accordingly, the mass of the resultant head may be maintained or even reduced relative to heads of previous generations. In other approaches, the modules may be constructed as a unitary body. Those skilled in the art, armed with the present teachings, will appreciate that other known methods of manufacturing such heads may be adapted for use in constructing such heads. Moreover, unless otherwise specified, processes and materials of types known in the art may be adapted for use in various embodiments in conformance with the teachings herein, as would become apparent to one skilled in the art upon reading the present disclosure.

Figure 8A:
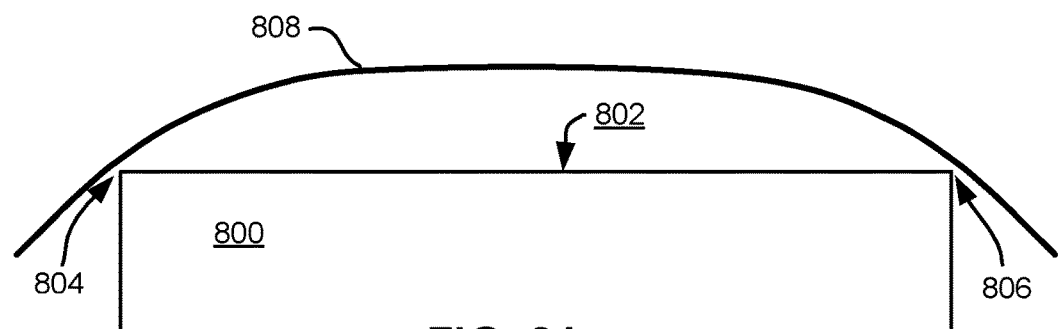
FIGS. 8A-8C are schematics depicting the principles of tape tenting.
Figure 8B:
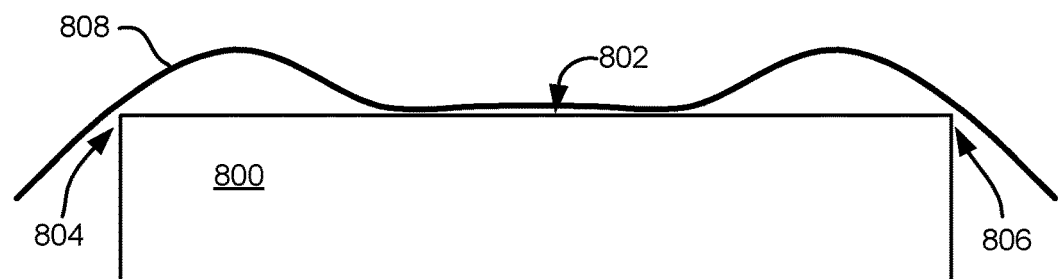
Figure 8C:
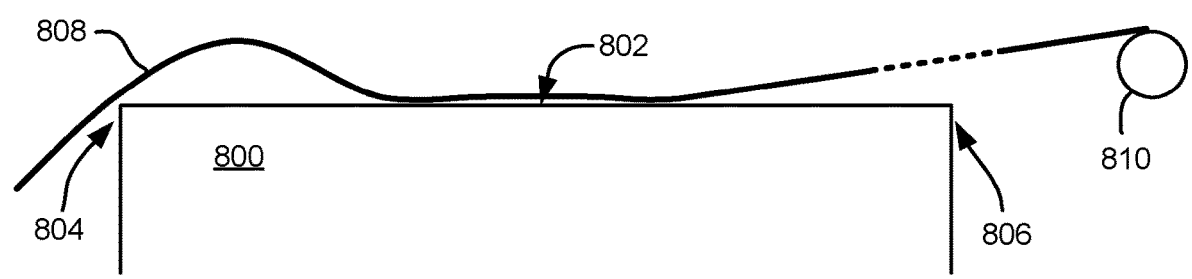

As a tape is run over a module, it is preferred that the tape passes sufficiently close to magnetic transducers on the module such that reading and/or writing is efficiently performed, e.g., with a low error rate. According to some approaches, tape tenting may be used to ensure the tape passes sufficiently close to the portion of the module having the magnetic transducers. To better understand this process, FIGS. 8A-8C illustrate the principles of tape tenting. FIG. 8A shows a module 800 having an upper tape bearing surface 802 extending between opposite edges 804, 806. A stationary tape 808 is shown wrapping around the edges 804, 806. As shown, the bending stiffness of the tape 808 lifts the tape off of the tape bearing surface 802. Tape tension tends to flatten the tape profile, as shown in FIG. 8A. Where tape tension is minimal, the curvature of the tape is more parabolic than shown.

FIG. 8B depicts the tape 808 in motion. The leading edge, i.e., the first edge the tape encounters when moving, may serve to skive air from the tape, thereby creating a subambient air pressure between the tape 808 and the tape bearing surface 802. In FIG. 8B, the leading edge is the left edge and the right edge is the trailing edge when the tape is moving left to right. As a result, atmospheric pressure above the tape urges the tape toward the tape bearing surface 802, thereby creating tape tenting proximate each of the edges. The tape bending stiffness resists the effect of the atmospheric pressure, thereby causing the tape tenting proximate both the leading and trailing edges. Modeling predicts that the two tents are very similar in shape.

FIG. 8C depicts how the subambient pressure urges the tape 808 toward the tape bearing surface 802 even when a trailing guide 810 is positioned above the plane of the tape bearing surface.

It follows that tape tenting may be used to direct the path of a tape as it passes over a module. As previously mentioned, tape tenting may be used to ensure the tape passes sufficiently close to the portion of the module having the magnetic transducers, preferably such that reading and/or writing is efficiently performed, e.g., with a low error rate.

Magnetic tapes may be stored in tape cartridges that are, in turn, stored at storage slots or the like inside a data storage library. The tape cartridges may be stored in the library such that they are accessible for physical retrieval. In addition to magnetic tapes and tape cartridges, data storage libraries may include data storage drives that store data to, and/or retrieve data from, the magnetic tapes. Moreover, tape libraries and the components included therein may implement a file system which enables access to tape and data stored on the tape.

File systems may be used to control how data is stored in, and retrieved from, memory. Thus, a file system may include the processes and data structures that an operating system uses to keep track of files in memory, e.g., the way the files are organized in memory. Linear Tape File System (LTFS) is an exemplary format of a file system that may be implemented in a given library in order to enables access to compliant tapes. It should be appreciated that various embodiments herein can be implemented with a wide range of file system formats, including for example IBM Spectrum Archive Library Edition (LTFS LE). However, to provide a context, and solely to assist the reader, some of the embodiments below may be described with reference to LTFS which is a type of file system format. This has been done by way of example only, and should not be deemed limiting on the invention defined in the claims.

A tape cartridge may be "loaded" by inserting the cartridge into the tape drive, and the tape cartridge may be "unloaded" by removing the tape cartridge from the tape drive. Once loaded in a tape drive, the tape in the cartridge may be "threaded" through the drive by physically pulling the tape (the magnetic recording portion) from the tape cartridge, and passing it above a magnetic head of a tape drive. Furthermore, the tape may be attached on a take-up reel (e.g., see 121 of FIG. 1A above) to move the tape over the magnetic head.

Once threaded in the tape drive, the tape in the cartridge may be "mounted" by reading metadata on a tape and bringing the tape into a state where the LTFS is able to use the tape as a constituent component of a file system. Moreover, in order to "unmount" a tape, metadata is preferably first written on the tape (e.g., as an index), after which the tape may be removed from the state where the LTFS is allowed to use the tape as a constituent component of a file system. Finally, to "unthread" the tape, the tape is unattached from the take-up reel and is physically placed back into the inside of a tape cartridge again. The cartridge may remain loaded in the tape drive even after the tape has been unthreaded, e.g., waiting for another read and/or write request. However, in other instances, the tape cartridge may be unloaded from the tape drive upon the tape being unthreaded, e.g., as described above.

Magnetic tape is a sequential access medium. Thus, new data is written to the tape by appending the data at the end of previously written data. It follows that when data is recorded in a tape having only one partition, metadata (e.g., allocation information) is continuously appended to an end of the previously written data as it frequently updates and is accordingly rewritten to tape. As a result, the rearmost information is read when a tape is first mounted in order to access the most recent copy of the metadata corresponding to the tape. However, this introduces a considerable amount of delay in the process of mounting a given tape.

To overcome this delay caused by single partition tape mediums, the LTFS format includes a tape that is divided into two partitions, which include an index partition and a data partition. The index partition may be configured to record metadata (meta information), e.g., such as file allocation information (Index), while the data partition may be configured to record the body of the data, e.g., the data itself.

Figure 9:
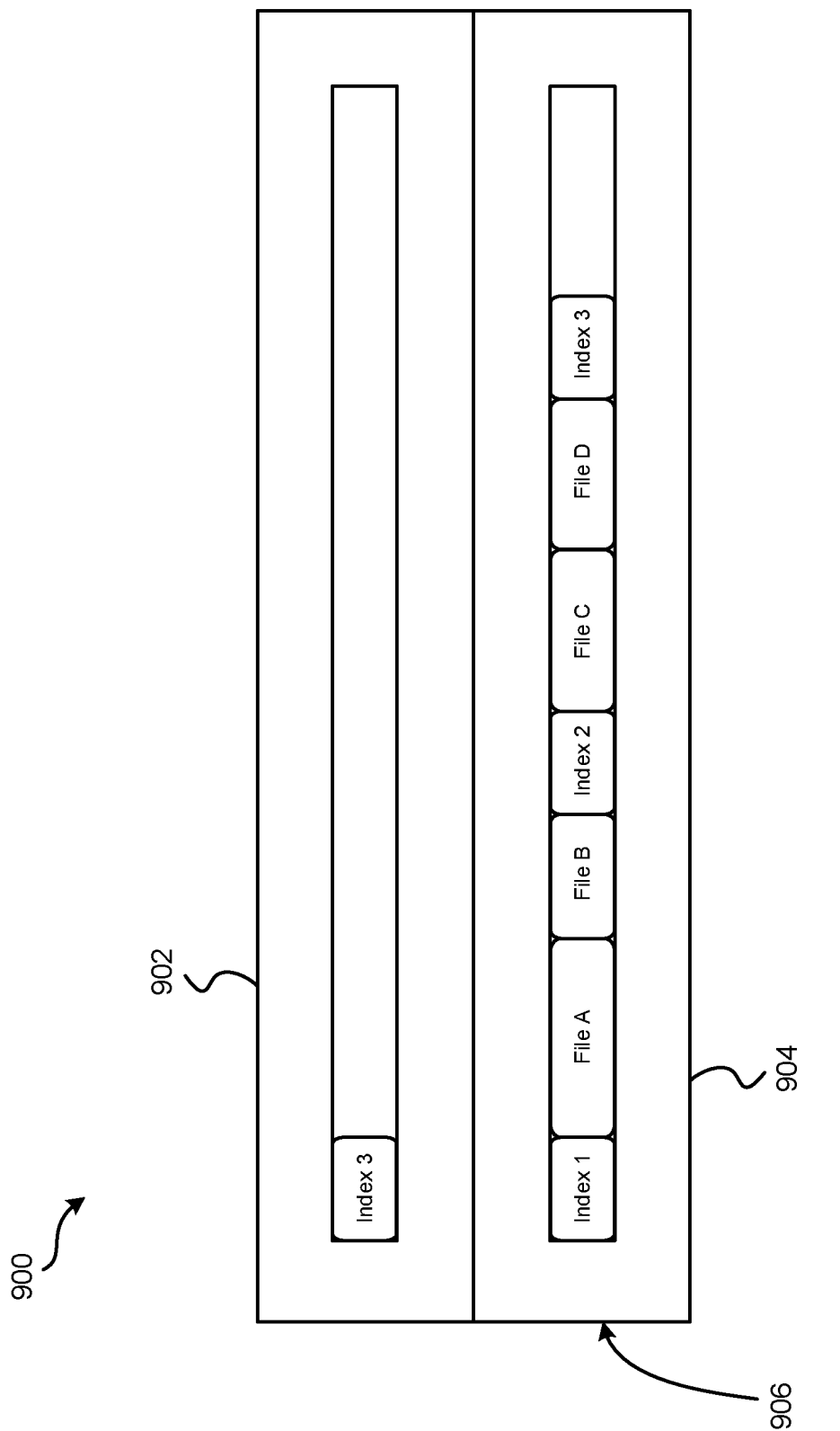
FIG. 9 is a representational diagram of files and indexes stored on a magnetic tape according to one embodiment.

Looking to FIG. 9, a magnetic tape 900 having an index partition 902 and a data partition 904 is illustrated according to one embodiment. As shown, data files and indexes are stored on the tape. The LTFS format allows for index information to be recorded in the index partition 902 at the beginning of tape 906, as would be appreciated by one skilled in the art upon reading the present description.

As index information is updated, it preferably overwrites the previous version of the index information, thereby allowing the currently updated index information to be accessible at the beginning of tape in the index partition. According to the specific example illustrated in FIG. 9, a most recent version of metadata Index 3 is recorded in the index partition 902 at the beginning of the tape 906. Conversely, all three version of metadata Index 1, Index 2, Index 3 as well as data File A, File B, File C, File D are recorded in the data partition 904 of the tape. Although Index 1 and Index 2 are old (e.g., outdated) indexes, because information is written to tape by appending it to the end of the previously written data as described above, these old indexes Index 1, Index 2 remain stored on the tape 900 in the data partition 904 without being overwritten.

The metadata may be updated in the index partition 902 and/or the data partition 904 the same or differently depending on the desired embodiment. According to some embodiments, the metadata of the index and/or data partitions 902, 904 may be updated in response to the tape being unmounted, e.g., such that the index may be read quickly from the index partition when that tape is mounted again. The metadata is preferably also written in the data partition 904 so the tape may be mounted using the metadata recorded in the data partition 904, e.g., as a backup option.

According to one example, which is no way intended to limit the invention, LTFS LE may be used to provide the functionality of writing an index in the data partition when a user explicitly instructs the system to do so, or at a time designated by a predetermined period which may be set by the user, e.g., such that data loss in the event of sudden power stoppage can be mitigated.

Damage to TMR sensors is often very difficult to detect. Conventional techniques for detecting damage to TMR sensors are expensive, inefficient, and/or ineffective. For example, detecting dielectric breakdown in a TMR sensor by measuring the sensor resistance and comparing the resistance to an expected value is not feasible on a manufacturing line because manufacturing processes of TMRs often cause variations in resistance other than variations caused by dielectric breakdown. Furthermore, externally generated magnetic fields may damage magnetic responses of materials within heads in which TMR sensors are installed. Externally generated magnetic fields may also be too expensive and/or time consuming to implement in the manufacturing process.

There are additional difficulties in detecting damage where TMR sensors of different geometries and resistance values are incorporated into a single product. A constant current source intensifies these difficulties. For example, a product comprising a constant current source limits the maximum current applied to the sensors to avoid damage to the sensors. The current is conventionally based on the highest expected resistance for all parts of the product. In this case, the same bias currents are applied to all the TMR sensors in the product despite any variations in resistance values. Due to large variations in TMR geometries and/or resistances, an expected slope parameter changes dramatically. The range in expected slope values for TMRs with resistance values ranging over a factor of 2 to 4 may be so large that using the same upper and lower limits for failure values for all TMRs in a product results in missing damaged TMR sensors.

Various embodiments of the present invention provide efficient and cost-effective methods for detecting damage to TMR sensors with varying geometries and/or resistances in a single product with a constant current source. Various embodiments include passing a range of bias currents through TMR sensors. The bias current passing through the TMR sensor creates a magnetic field within the TMR sensor that interacts with any defects in the TMR sensor (e.g., dielectric damage, pin-holes, lapping smears, magnetic domains, noise, etc.). The resistance (R) of the TMR sensor may be analyzed with respect to the current (I), voltage (V), etc. including analyses of changes to slopes calculated with any measured and/or expected values.

TMR sensors conduct more current the higher the applied voltage. The resistance of the TMR sensors drops with increasing voltage applied across the tunnel junction. Conventional TMR read sensors used in the storage industry are rectangular devices with a width, TW, and a stripe height, SH. The current flows perpendicular to the TMR sheet described by the area of TW·SH. The resistance of a TMR sensor, $R_{TMRo}$ at low current, $I_o$, is $$R_{TMRo} = \frac{RA_o}{(TW \cdot SH)} \quad (1a)$$

with $$RA_o = RA(I_o) \quad (1b)$$

where resistance-times-area (RA) is a parameter of the TMR sensor. The RA decreases with increasing voltage, $V_{mr}$, applied to the TMR and the resistance of the TMR, $R_{TMR}(V_{mr})$, also decreases with increasing $V_{mr}$.

TMR sensors are used in the data storage industry to read magnetic data from magnetic media as described above. TMR sensors may be lapped from a high initial SH at the wafer level to a final desired range as the TMR sensors pass over magnetic coated hard disks and/or tape media. TMRs in a product may have large variations in SH due to the described processing. The range of SH may be a factor of about 2 to 4 or higher. For a current based test system, overbiasing the sensor may cause dielectric breakdown. Limiting the voltage across the sensor may prevent overbiasing. The large variations in SH, and therefore, resistance, limit the maximum bias current used, $I_{bias-max}$, to the devices with the highest resistances, ($R_{TMR-Max}$=max({$R_{TMR}$})), and the maximum allowed voltage, $V_{bias-max}$ is given by $$I_{bias-max} = \frac{V_{bias-max}}{R_{TMR-Max}}.$$

Figure 10:
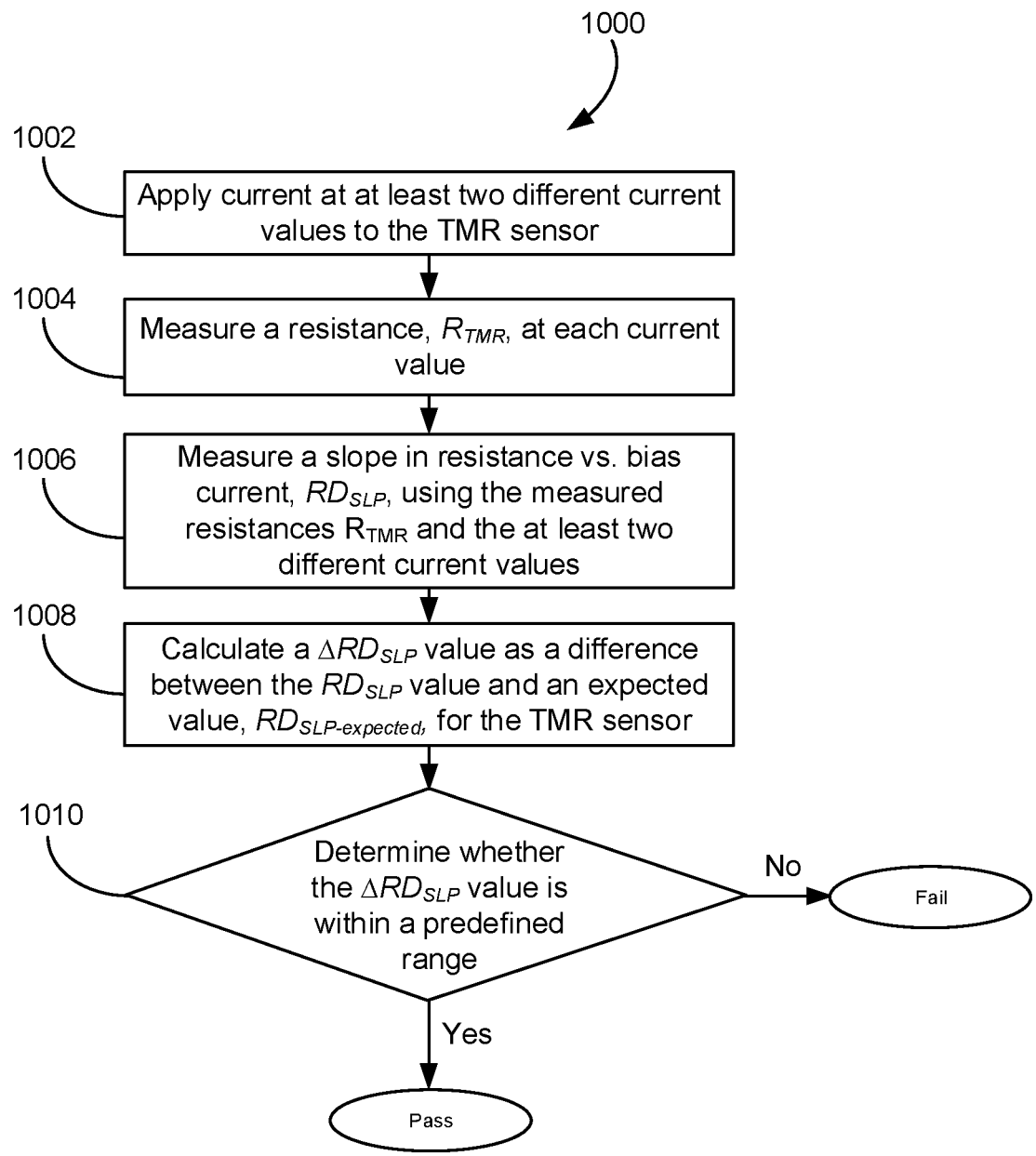
FIG. 10 is a flowchart of a method, according to one embodiment.

Now referring to FIG. 10, a flowchart of a method 1000 is shown according to one embodiment. The method 1000 may be performed in accordance with the present invention in any of the environments depicted in FIGS. 1-9 and 11-15, among others, in various embodiments. Of course, more or less operations than those specifically described in FIG. 10 may be included in method 1000, as would be understood by one of skill in the art upon reading the present descriptions.

Each of the steps of the method 1000 may be performed by any suitable component of the operating environment. For example, in various embodiments, the method 1000 may be partially or entirely performed by computers, or some other device having one or more processors therein. The processor, e.g., processing circuit(s), chip(s), and/or module(s) implemented in hardware and/or software, and preferably having at least one hardware component may be utilized in any device to perform one or more steps of the method 1000. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 10, method 1000 includes operation 1002 which comprises applying current at least two different current values to a TMR sensor. A current may be applied in any manner known in the art.

Operation 1004 includes measuring a resistance, $R_{TMR}$, at each current value. A resistance, $R_{TMR}$, may be determined and/or measured using any technique known in the art.

Operation 1006 includes measuring a slope in resistance vs. bias current, $RD_{SLP}$, using the measured resistances and the at least two different current values.

In various embodiments, a device may comprise an array of TMR sensors which do not corrode simultaneously. In one approach, to test the integrity of a TMR read element, measure the slope of the change in resistance with bias current, $RD_{SLP}(R_{TMR}(I_{bias}))$:

$$RD_{SLP}(R_{TMR}(I_{bias})) = \frac{(R_{TMR}(I_{bias}) - R_{TMR}(I_0))}{[I_{bias} - I_0]}. \quad (2a)$$

In other approaches, measure a normalized slope of the change in resistance with bias current:

$$RD_{SLP}(R_{TMR}(I_{bias})) = \frac{(R_{TMR}(I_{bias}) - R_{TMR}(I_0))}{([I_{bias} - I_0] \cdot R_{TMR}(I_0))}. \quad (2b)$$

The resistance, $R_{TMR}$, and the slope in resistance vs. bias current, $RD_{SLP}$, may be taken at at least two current values as given in Equations 2a-b. The slope, $RD_{SLP}$, may be taken by fitting $R_{TMR}(I_{bias})$ to a linear equation of $R_{TMR}$ versus $I_{bias}$ in other embodiments.

Operation 1008 comprises calculating a $\Delta RD_{SLP}$ value as a difference between the $RD_{SLP}$ value and an expected value, $RD_{SLP-expected}$, for the TMR sensor. In a preferred embodiment, $RD_{SLP-expected}$ is not the same for all TMRs in a plurality of TMR sensors for a product.

Decision block 1010 includes determining whether the $\Delta RD_{SLP}$ value is within a predefined range. In response to determining that the $\Delta RD_{SLP}$ value is outside the predefined range, method 1000 outputs an indication that the TMR sensor fails. In response to determining that the $\Delta RD_{SLP}$ value is within the predefined range, method 1000 outputs an indication that the TMR sensor passes. The indication may be output to the user, drive, remote computer, operating system, etc. The indication may be an aural and/or visual notification.

In various configurations, method 1000 may output an indication and/or label TMR sensors whose measurements are within the predefined range as "good." Good TMR sensors may refer to TMR sensors which pass one or more of the various testing processes described herein. Method 1000 may output an indication and/or label TMR sensors whose measurements are outside the predefined range as "bad." Bad TMR sensors may refer to TMR sensors which fail one or more of the various testing processes described herein.

In one embodiment, the expected value, $RD_{SLP-expected}$, is determined by performing calculations on measurements for a plurality of TMR sensors whose resistance values at a fixed current or voltage, $R_{TMRo}$, span the range of resistance values for the plurality of TMR sensors in a product. The calculations may comprise measuring a resistance, $R_{TMRo}$, and a slope in resistance vs. bias current, $RD_{SLP}$, for each of the plurality of TMR sensors. The calculations may comprise creating a fit for $RD_{SLP}$ vs. $R_{TMRo}$ values for the sensors according to any of the embodiments described in detail below. The expected value $RD_{SLP-expected}$ may be determined based on the fit.

The calculations comprise creating a fit for $RD_{SLP}$ vs. $R_{TMRo}$ using the $RD_{SLP}$ and $R_{TMRo}$ values for the sensors. In one approach, the fit may be a polynomial fit. The polynomial fit may be generated by $$RD_{SLP-FIT} = a_0 + a_1 \cdot R_{TMR} + a_2 \cdot R^2_{TMR}. \quad (3)$$

For a cabled device, the cable resistance, $R_c$, may be added to a total resistance, as will any internal lead resistances, $R_L$, of $R_{DUT}$, where $$R_{TMR} = R_{DUT} - R_c - R_L.$$

A polynomial fit for $RD_{SLP}$ vs. $R_{TMRo}$ using the $RD_{SLP}$ and $R_{TMRo}$ values for the sensors may be created using any technique known in the art. Adherence of measured data to the fit data may be regarded as the "smoothness" of the polynomial fit when plotted. Deviation of the measured data from the polynomial fit (e.g., such as kinks and/or other variations from the relatively smoother portions) may be indicative of outliers. In various approaches, if the outliers are within a predefined range outside the fit, the TMR element may be considered damaged.

In another approach, creating the fit for $RD_{SLP}$ vs. $R_{TMRo}$ using the $RD_{SLP}$ and $R_{TMRo}$ values for the sensors includes creating a median fit for $RD_{SLP}$ vs. $R_{TMRo}$ in a narrow predefined range around each $R_{TMRo}$ value using measured $RD_{SLP}$ and $R_{TMRo}$ values from a look-up table. The look-up table may comprise pre-determined $RD_{SLP}$ values, $R_{TMR}$ values, $R_{TMRo}$ values, etc., for a set of sensors whose resistance values, $R_{TMR}$, span the range of resistance values for the plurality of TMR sensors of the product.

In yet another approach, creating the fit for $RD_{SLP}$ vs. $R_{TMR}$ using the $RD_{SLP}$ and $R_{TMR}$ values for the sensors includes creating a standard deviation, $\Sigma RD_{SLP}$, of $RD_{SLP}$ vs. $R_{TMRo}$ using the $RD_{SLP}$ and $R_{TMR}$ values for the sensors. In this approach, $\Delta RD_{SLP}$ may be calculated as a difference between the $RD_{SLP}$ value and an expected value, $RD_{SLP-expected}$, for each of the plurality of TMR sensors. Creating a fit may comprise determining whether the $\Delta RD_{SLP}$ value is within a second predefined range. The second predefined range may be based on $\Sigma RD_{SLP}$. The lower limit of the second predefined range may be determined by $\Delta RD_{SLP} \geq -N_{LL} \cdot \Sigma RD_{SLP}$ and the upper limit of the second predefined range may be determined by $RD_{SLP} \leq N_{UL} \cdot \Sigma RD_{SLP}$ where $N_{LL}$ and $N_{UL}$ are predefined positive real numbers. In a preferred approach, the predefined positive real numbers, $N_{LL}$ and $N_{UL}$, are about 4.

In response to determining that the $\Delta RD_{SLP}$ value is outside the second predefined range, the method 1000 outputs an indication that the TMR sensor fails. In response to determining that the $\Delta RD_{SLP}$ value is within the second predefined range, the method 1000 outputs an indication that the TMR sensor passes.

In other approaches, determining that TMR sensors pass or fail includes comparing the $RD_{SLP}$ value of each sensor to an expected value generated by the fit. TMR sensors with slope values outside the normal distribution have a higher probability of having a magnetic and/or physical defect. In various embodiments discussed herein, the term "damage" refers generally to any abnormalities and/or defects in the TMR sensor which affect the operation of the TMR sensor. For example, damage to a TMR sensor may include magnetic domains, instability, defects, breakdown of materials of the TMR sensor, etc.

Determining whether a TMR sensor passes or fails may include detecting outlier $RD_{SLP}$ values for the sensors. In various approaches, detecting outliers includes performing a maximum nearest neighbor analysis, a minimum nearest neighbor analysis, a median nearest neighbor analysis, etc. A "nearest neighbor analysis" as referred to herein, includes analyses for comparing measured data of individual sensors to one another in a multi-sensor device. For example, a multi-sensor device may comprise ten TMR sensors arranged in a linear, side-by-side manner where the nearest neighbor of each TMR sensor is the adjacent TMR sensor on either side of the TMR sensor in the arrangement. Nearest neighbor analysis may be used for any measured and/or calculated value. In one approach, a user, manufacturer, supplier, etc. may specify a predefined range pertaining to the extent to which the measurements for each sensor may differ from one another.

The conventional method of "nearest neighbor analysis" as described above includes fitting all data to a polynomial and determining outliers by the deviation from the fit. The problem with this conventional approach is that the fit often does not accurately yield the proper expected values because the fit is shifted by including outliers in the fit. Another conventional method for nearest neighbor analysis includes comparing the value of each part to its neighbors. The problem with this conventional approach is that using the minimum deviation from the neighbor misses potential outliers compared to "good" parts and using the maximum deviation from the neighbor oversamples the outliers.

In one illustrative example, using the minimum deviation from the neighbors undersamples the damaged or bad tracks. If track 2 and track 3 are damaged and have similar values to one another, yet the values for track 2 and track 3 are relatively farther from the values of track 1 and track 4, using the minimum deviation will result in comparing track 2 and track 3 to one another. Track 2 and track 3 will be falsely labeled as good even though track 2 and track 3 are relatively farther from the good tracks.

An example of oversampling damaged or bad tracks using the maximum deviation from the neighbors occurs when track 2 is damaged but track 1 and track 3 are good. While the maximum deviation will correctly indicate that track 3 is damaged (e.g., due to a relatively larger deviation from either track 1 or track 3), track 1 and track 3 will be falsely labeled as damaged or bad because track 1 and track 3 have a relatively large deviation from track 2.

An improved nearest neighbor analysis as disclosed herein first excludes outlier TMR sensors using a nearest neighbor method which excludes parts based on the maximum deviation from the two nearest neighbors. Two approaches can be used for the remaining parts (e.g., the nonexcluded parts). A first approach (e.g., a polynomial fit with iterative exclusion method) includes fitting the remaining, nonexcluded parts to a polynomial and then comparing the $R_{TMR}$ value of a sensor to the expected value (e.g., $RD_{SLP-expected}$) from the polynomial fit to determine whether the $R_{TMR}$ value of the sensor is within a predefined range. Any parts which are within a predefined range of the polynomial fit are labeled "good." Any parts which are outside a predefined range of the polynomial fit are labeled "bad." Comparing all parts to the expected value from the polynomial fit and excluding parts which are not within the predefined range of the polynomial fit may be iterated until the labeling of good and bad parts remains about constant. In a preferred approach, the process may be iterated until the labeling of excluded sensors remains about constant for at least two consecutive iterations. In a second approach (e.g., a revised nearest neighbor fit with the iterative exclusion method), the nearest neighbor method of the first step is similarly used to exclude outlier TMR sensors based on the maximum deviation from the two nearest neighbors. TMR sensors within the maximum deviation from the two nearest neighbors may be labeled as good and TMR sensors outside the maximum deviation from the two nearest neighbors may be labeled as bad. The nearest neighbor comparison is repeated using only the two nearest neighbors which were labeled as good on the previous pass. This second approach may be repeated until the labeling of good and bad parts remains about constant. In a preferred approach, the process may be iterated until the labeling of excluded sensors remains about constant for at least two consecutive iterations. In both approaches, the sensors which are labeled as good may be used to create the fit for $RD_{SLP}$ vs. $R_{TMR}$. The improved nearest neighbor analysis as disclosed may be applied to exclude TMR sensors in any embodiment presented herein.

In various approaches, the nonexcluded TMR sensors may be fit to a polynomial of $RD_{SLP}$ vs. TMR track, m, wherein m is sequential from 1 to the number of TMR sensors located on the common substrate, and the polynomial fit to $RD_{SLP}$ vs. m for track m is $RD_{SLP-expected}$ for track m, $RD_{SLP-expected-m}$. The measured value of $RD_{SLP}$ for each sensor, $RD_{SLP-m}$, may be compared to a $RD_{SLP-expected-m}$ value from the polynomial fit to determine whether the $RD_{SLP}$-m value of the sensor is within the second predefined range as described above.

In one embodiment, a user may specify a range of acceptable deviation (e.g., $\Delta R_n = R_n - R_{fit-n}$) from the polynomial fit outside of which the TMR sensor is considered an outlier. For example, if $\Delta R_n < \Delta R_{LL}$ and/or $\Delta R_n > \Delta R_{UL}$, track n may be considered an outlier. If $\Delta R_n > \Delta R_{LL}$ and/or $\Delta R_n < \Delta R_{UL}$, track n may not be considered an outlier. A range of acceptable deviation for any of the disclosed embodiments herein may be theoretically and/or experimentally determined.

Note that the above-mentioned outlier exclusion methods can be used for any parameter in a group of parts which are built and processed simultaneously, and which are expected to be self-similar or nearly identical. In these cases, the values for the parts along the line of parts are expected to vary in a smooth manner so the difference in value from one device to the next in the line should be minimal. In these cases, as long as the parts are good and not damaged, the values of the parameters should be fit well with a polynomial of order 0 (constant), 1 (linear), or 2 (quadratic). Examples of parameters are resistance and/or quasi-static magnetic amplitude for TMR sensors built on a wafer and subsequently processed to lap a row of parts into a tape head module, MRAM, and/or any other semiconductor devices known in the art.

In other embodiments, the accuracy of determining the integrity of TMR elements may be improved where a group of TMRs (e.g., 8, 16, 32, etc.) are processed within a single module from the same wafer and lapped simultaneously. The group of TMR sensors may be physically adjacent to one another and lapped to ostensibly the same stripe height. The operations of 1000 may be applied where all sensors are in the same module. For example, where all sensors are in the same module, the sensors may have substantially similar slope values.

In an alternative approach, method 1000 may include a residual method for flagging damaged, outlier tracks using the polynomial fit described above for the expected $RD_{SLP}$. In one approach, the residual method may include applying currents $I_1$ and $I_2$ to each of n TMR sensors located on a common substrate and measuring resistance, $R_{TMR}(I_m)$, m=1:2. The residual method may include calculating the slope, $RD_{SLPn}$, by $$RD_{SLPn} = \frac{[R_{TMR}(I_2) - R_{TMR}(I_1)]}{(I_2 - I_1)}.$$

In a first approach, the residual method includes fitting $RD_{SLP}(R_{TMR})$ to a quadratic in $R_{TMR}$ according to Equation 3 and the standard deviation $\Sigma_{SLP}(R_{TMR})$ of the data may be fit according to:

$$\underset{SLP}{\Sigma} = \exp(-s + s_2 \cdot R_{TMR})$$

or $$\underset{SLP}{\Sigma} = \frac{1}{(d_1 + d_2 \cdot R_{TMR})}.$$

In one operation of the first approach, calculate the residuals for the $n^{th}$ element by $\Delta RD_{SLP-n} = RD_{SLP-n} - RD_{SLP-FIT}$. For a good TMR, a lower limit may be set as $\Delta RD_{SLP-LL} = -N_{LL} \cdot \Sigma_{SLP}(R_{TMR})$ and an upper limit may be set as $\Delta RD_{SLP-UL} = N_{UL} \cdot \Sigma_{SLP}(R_{TMR})$ where $N_{LL}$ and $N_{UL}$ are predefined positive real numbers. If $RD_{SLP-LL} \leq \Delta RD_{SLP-n} \leq \Delta RD_{SLP-UL}$, the TMR element is good. If no, the TMR element is an outlier. In some approaches, an outlier may be considered damaged and marked for removal. The upper limit and/or lower limit may be experimentally and/or theoretically determined. The upper limit and/or lower limit may be set by the user, by the manufacturer, by default settings, etc.

In a second approach, calculate a module median, $RD_{SLP-Median}$ and the residuals for the $n^{th}$ element by $\Delta RD_{SLP-n} = RD_{SLP-n} - \text{median}\{RD_{SLP}\}$. For a good TMR, a lower limit may be set as $\Delta Res_{SLP-LL}$ and an upper limit may be set as $\Delta Res_{SLP-UL}$. If $\Delta Res_{SLP-LL} \leq \Delta RD_{SLP-n} \leq \Delta Res_{SLP-UL}$, the TMR element is good. If no, the TMR element is an outlier. An outlier may be labeled as a "bad" sensor in various configurations. In some approaches, an outlier may be considered damaged and marked for removal.

In various embodiments, for either approach of the residual method, $N_{LL}$ and $N_{UL}$ are set to positive and negative predefined real numbers. In preferred configurations, the predefined real number is about 4.

Many testers are constant current testers. In one exemplary implementation of the following embodiment of method 1100, a constant current based tester may be used as a pseudo voltage based tester by iteratively changing the current, measuring the resistance, calculating the voltage and resetting the current to achieve the desired voltage according to the various operations described in detail below.

Figure 11:
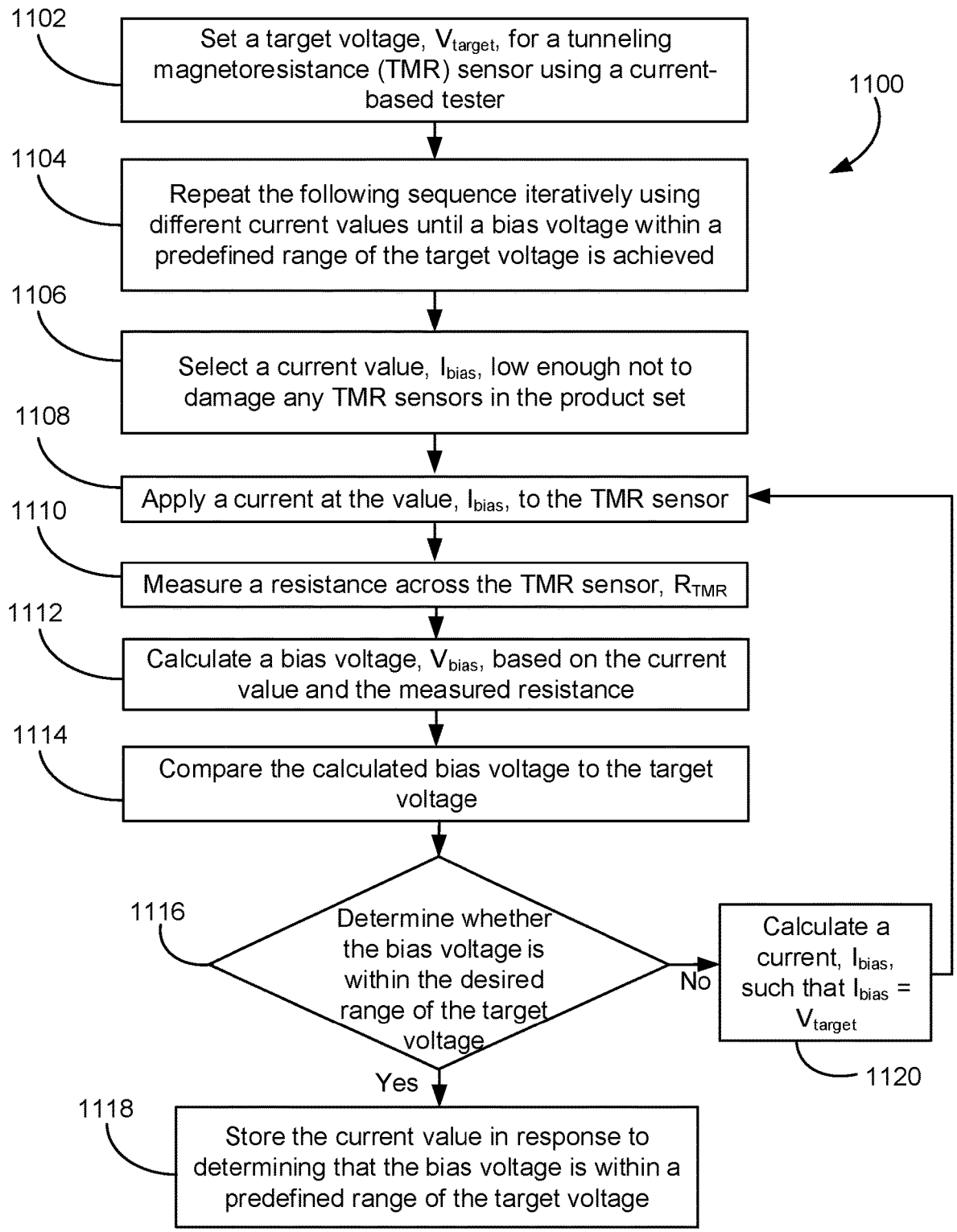
FIG. 11 is a flowchart of a method, according to one embodiment.

Now referring to FIG. 11, a flowchart of a method 1100 is shown according to one embodiment. The method 1100 may be performed in accordance with the present invention in any of the environments depicted in FIGS. 1-10 and 12-15, among others, in various embodiments. Of course, more or less operations than those specifically described in FIG. 11 may be included in method 1100, as would be understood by one of skill in the art upon reading the present descriptions.

Each of the steps of the method 1100 may be performed by any suitable component of the operating environment. For example, in various embodiments, the method 1100 may be partially or entirely performed by computers, or some other device having one or more processors therein. The processor, e.g., processing circuit(s), chip(s), and/or module(s) implemented in hardware and/or software, and preferably having at least one hardware component may be utilized in any device to perform one or more steps of the method 1100. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 11, method 1100 includes operation 1102 which comprises setting a target voltage for a tunneling magnetoresistance (TMR) sensor. In a preferred approach, the target voltage, $V_{target}$, may be set using a current-based tester. In one approach, an initial bias current is relatively low. The target voltage for a TMR sensor (e.g., the desired voltage) may be defined as $V_{set}$. In other approaches, the target voltage may be referred to as $V_{target}$.

Operation 1104 comprises repeating the following sequence iteratively using different current values until a bias voltage within a predefined range of the target voltage is achieved. The predefined range of the target value may be denoted by $\Delta V_{limit}$. $\Delta V_{limit}$ may refer to the accuracy in setting a $V_{biasn}$ to the desired $V_{set}$. In some approaches, the sequence may be iteratively repeated for n steps until $V_{biasn}$ is within a range of the target value (e.g., $\Delta V_{limit}$ of $V_{set}$). In one approach, the $\Delta V_{limit}$ is set such that $R_n$ is the resistance measured at $(R_{dut}(I_{biasn}))$ in the $n^{th}$ step with current $I_{biasn}$ is:

[$Rdut,IbiasUse$]=Function($Ibias1, Vset$).

In various approaches, a predefined range may be set by the user, by a manufacturer, default settings, etc. A predefined range of the target voltage may be theoretically and/or experimentally determined.

In one approach, the different current values may be selected such that the voltage is within a range of a minimum magnitude voltage ($V_{min}$) to a maximum magnitude voltage ($V_{max}$). In a preferred approach, the different current values are selected in n evenly spaced steps.

In a preferred embodiment, $V_{set}$ is selected as a value lower than a maximum allowed voltage, $V_{max}$. In another preferred approach, $V_{biasn}$ is less than or equal to $V_{set}$.

Operation 1106 comprises selecting a current value. In one approach, an initial bias current, $I_{bias1}$, alternatively referred to herein as $I_{set}$, may be set such that $V_{set}$ for the TMR with the highest possible resistance, $R_{max}$, is given by:

$$n = 1, I_{bias1} = \frac{V_{set}}{R_{TMR-expected}}. \quad (4)$$

where $R_{TMR-expected}$ is an expected resistance for the TMR sensor. In one embodiment, the values of $R_{TMR-expected}$ for all iterations other than the initial iterations are the values of $R_{TMR}$ from the previous iteration.

In other approaches, an initial bias current, $I_{bias}$, set for the TMR with the highest possible resistance, $R_{max}$, prevents damage to the parts. Damage to the parts is prevented where the bias voltage is less than the $V_{set}$ chosen and less than the maximum allowed voltage, $V_{max}$, for the safe operation of the TMRs used.

Operation 1108 comprises applying a current at the current value to the TMR sensor. In one approach, the applied current at the current value may be denoted as $I_{biasn}$ or alternatively, as $I_{set}$. The current may be applied in any manner known in the art.

Operation 1110 comprises measuring a resistance across the TMR sensor. The resistance may be measured in any manner known in the art. In one approach, the resistance may be measured as:

$$R_n = R_{dut}(I_{biasn}). \quad (5)$$

The resistance measurement may be denoted as $R_{TMR}$ in various approaches.

Operation 1112 comprises calculating the bias voltage based on the current value and measured resistance. In one approach, the bias voltage may be calculated as:

$$V_{biasn} = R_n(I_{biasn})*(I_{biasn}). \quad (6)$$

Operation 1114 comprises comparing the calculated bias voltage, in some approaches, denoted as $V_{cal}$, or, alternatively, denoted as $V_{biasn}$, to the target voltage, denoted as $V_{target}$. In one approach, comparing the calculated bias voltage to the target voltage includes checking whether the $V_{set}$ has been reached. In one embodiment, if abs($V_{biasn}-V_{set}$)≤$\Delta V_{limit}$, $R_{dut}=R_n$, and IbiasUse=$I_{biasn}$, the $V_{set}$ has been reached. If abs($V_{biasn}-V_{set}$)>$\Delta V_{limit}$, for n=n+1 and $$I_{biasn} = \frac{V_{set}}{R_{n-1}},$$

update the $I_{biasn}$ according to operation 1104, 1106, and 1108.

Decision block 1116 includes determining whether $V_{cal}$ is within a preferred range of $V_{target}$. The predefined range may be experimentally and/or theoretically determined. If $V_{cal}$ is within a predefined range of $V_{target}$, proceed to operation 1118.

Operation 1118 comprises storing the current value in response to determining that the bias voltage is within a predefined range of the target voltage. In one approach, determining that the bias voltage is within a predefined range of the target value includes determining that abs ($V_{biasn}-V_{set}$)≤$\Delta V_{limit}$. In one embodiment, the current value, $I_{biasn}$, may be stored in an lset.txt file. In other approaches, the $I_{biasn}$ may be stored in any manner known in the art.

Operation 1120 includes, in response to determining $V_{cal}$ is not within a preferred range of $V_{target}$, calculating a current $I_{set}$ such that $I_{set}=V_{target}$ and proceeding to operation 1108. The method 1100 may iterate various operations as disclosed herein until it is determined that the bias voltage is within a predefined range of the target voltage.

In one approach, method 1100 includes setting the target voltage, $V_{target}$, based on target voltage values in a first file text, wherein the current values, $I_{bias}$, are stored in a second text file and the second text file is used during reading operations.

In one exemplary embodiment, the method 1100 comprises using two independent programs wherein Program 1 reads a first text file, RdFileIbias1.txt, comprising the stored current values (e.g., the $I_{bias}$ values stored in operation 1118) to apply to the TMRs. Program 1 may perform various current-based operations on the TMRs. Program 2 reads a second text file, RdFileVbias2.txt, comprising a set of target voltages, $V_{target}$. Program 2 may perform the various operations described in method 1100 and output the set of $I_{bias}$ values as determined from the various operations. The set of $I_{bias}$ values may be output and stored in the first text file (e.g., RdFileIbias1.txt) which may be used by Program 1. A complete program may comprise Program 2 running first to generate the RdFileIbias1.txt text file as an output, and then running Program 1 which reads the RdFileIbias1.txt text file generated by Program 2 during reading operations.

In various embodiments, the method 1100 may include reading the lset.txt file or any file which stores the $I_{biasn}$ current value. The method 1100 may include setting a current value, $I_{set}$, to the $I_{biasn}$ current value and measuring the resistance (e.g., $R_{TMR}=R_{TMR}(I_{set})$). The $V_{actual}$ may be measured for the current value. The $V_{actual}$ and/or $R_{TMR}$ may be stored in a lset.txt file or any other manner known in the art.

In another embodiment for modifying a constant current based tester for use as a pseudo voltage based tester, the resistances are measured at low current (voltage) for determining the current at all voltages. For example, the $I_o$ may be read where $I_o<V_{max}/R_{max}$. The $I_o$ may be set and the $R_{TMR}$ may be measured. A $V_{set}$ may be read and the $\{I_{set}\}$ may be calculated such that $\{I_{set}\}=\{V_{set}\}/R_{TMRo}$. In one embodiment, for a module comprising multiple TMRs, the $\{I_{set}\}$ values may be determined for all tracks. The $\{I_{set}\}$ values may be stored in an lset.txt file. In another embodiment, the $\{I_{set}\}$ values may be determined individually for all tracks. The actual voltages may be determined based on the operations of method 1100 as described above. In various embodiments, the execution times may be significantly reduced.

In yet another embodiment for a pseudo constant voltage tester, the voltage may be swept from the minimum magnitude voltage ($V_{min}$) to the maximum magnitude voltage ($V_{max}$) and back to the $V_{min}$ in n evenly spaced steps. For each n step, the resistance may be measured for both positive and negative polarities. The measured resistance for the given voltage swept from $V_{min}$ and $V_{max}$ for the positive polarity and from $-V_{max}$ and $-V_{min}$ the negative polarity may be defined as R($V_{Nup}$). The measured resistance for the same voltage when sweeping from $V_{max}$ to $V_{min}$ for the positive polarity and from $-V_{min}$ and $-V_{max}$ for the negative polarity may be defined as R($V_{Ndown}$). In this embodiment, the standard deviation in resistance may be determined according to $\{R(V_{Nup})-R(V_{Ndown})\}$. The standard deviation may be used to determine defects as outliers from the group. An outlier may be a value and/or a TMR sensor associated with a value which is outside a predefined range outside of an upper and/or lower limit. The upper and/or limits may be experimentally and/or theoretically determined.

In this embodiment, the slope of the resistance change, $RD_{SLP}$, may be defined as $$\frac{dR}{dV}$$

and the normalized resistance slope $RD_{SLP-Norm}$ may be defined as $$\frac{dR}{dV \cdot R}.$$

The derivatives may be determined from the resistance values measured for at least two voltages value (e.g., between $V_{min}$ and $V_{max}$) of the same polarity. Either $RD_{SLP}$ or $RD_{SLP\text{-}Norm}$ may be used to detect outliers from a group of TMR sensors. Similarly, an outlier may be a value and/or a TMR sensor associated with a value which is within a predefined range outside of an upper and/or lower limit. The upper and/or limits may be experimentally and/or theoretically determined.

Figure 12:
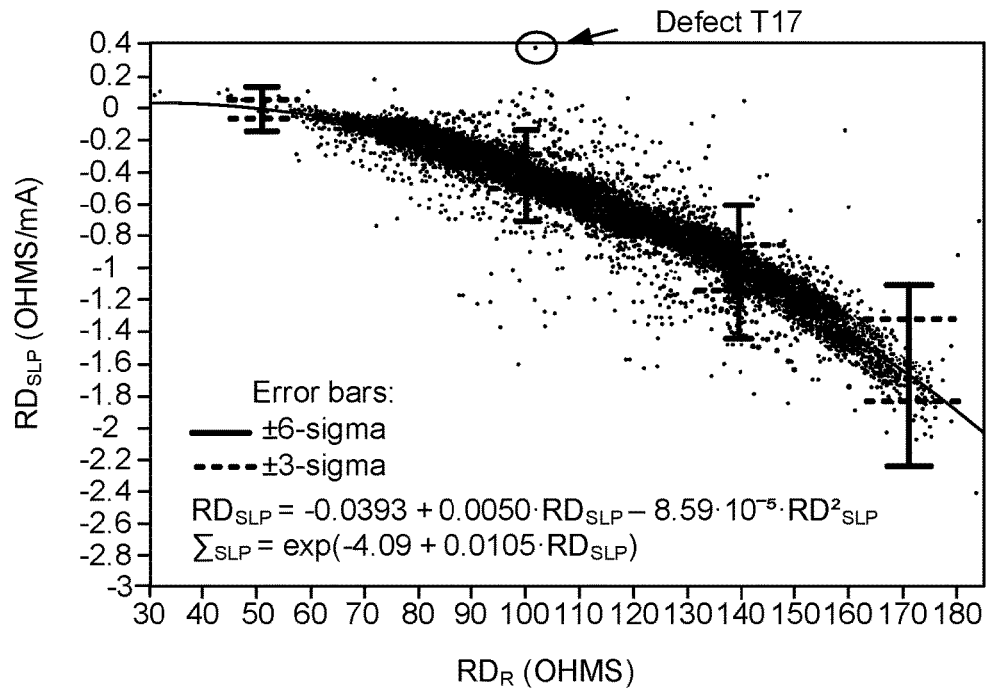
FIG. 12 is a plot of $RD_{SLP}$ versus cabled TMR resistance ($RD_R$), according to one embodiment.

FIG. 12 is a plot of $RD_{SLP}$ versus cabled TMR resistance ($RD_R$), taken at a single value of $I_{bias}$ of 1.2 mA, and an $I_o$ of 0.2 mA. $I_{bias}$ may be derived from Equation 2a in order to avoid dielectric breakdown for the sensors with the highest resistance. A single maximum current was used for a constant current tester for all TMRs within a product with a wide range of geometries (e.g., resistances). The expected $RD_{SLP}$ varies greatly across the product values of $R_{TMR}$. The range is from about 0 Ω/mA at 55Ω to about −2.0 Ω/mA at 180Ω. The resistance values range over a factor of 3 such that the voltage across the highest resistance parts is three times that of the low resistance parts. The error bars indicate a ±3 sigma (±3·$\Sigma_{SLP}$) and a ±6 sigma (±6·$\Sigma_{SLP}$) from $\Sigma_{SLP}$.

The slope, $RD_{SLP}$, may be fit to a polynomial curve, $RD_{SLP\text{-}polyfit}$, using Equation 3 with $a_o=-0.0393$ mA$^{-1}$, $a_1=0.0050$ mA$^{-1}$Ω$^{-1}$, and $a_2=-8.59\times10^{-5}$ mA$^{-1}$Ω$^{-2}$. The polynomial curve and fitting parameters are shown in FIG. 12.

To the first order, the expected $RD_{SLP}$ at a voltage, $V_{bias}$, for a fixed and sufficiently high bias (e.g., $I_{bias}=I_{test}=1.2$ mA), may be given by $R_{TMR}=V_{bias}/I_{test}$. The expected $RD_{SLPV\text{-}FIT}$ versus $V_{bias}$ may be determined using:

$$RD_{SLP\text{-}FIT}=v_0+v_1\cdot V_{bias}+v_2\cdot V_{bias}^2$$

where $v_0=a_0$, $$v_1 = \frac{a_1}{I_{test}}, \text{ and } v_2 = \frac{a_2}{I_{test}^2}.$$

The standard deviation versus voltage may be determined by:

$$\Sigma_{SLP}=\exp(-b+b_2\cdot V_{bias})\Omega/mA$$

where $b_1=s_1$ and $b_2=s_2$ or $$\Sigma_{SLP} = \frac{1}{(d_1+d_2\cdot R_{TMR})}\Omega/mA.$$

Other parameters may include a voltage slope defined by:

$$RD_{SLPV}(R_{TMR}(I_{bias})) = \frac{(R_{TMR}(V_{bias})-R_{TMR}(v_0))}{[V_{bias}-v_0]}.$$

Figure 13:
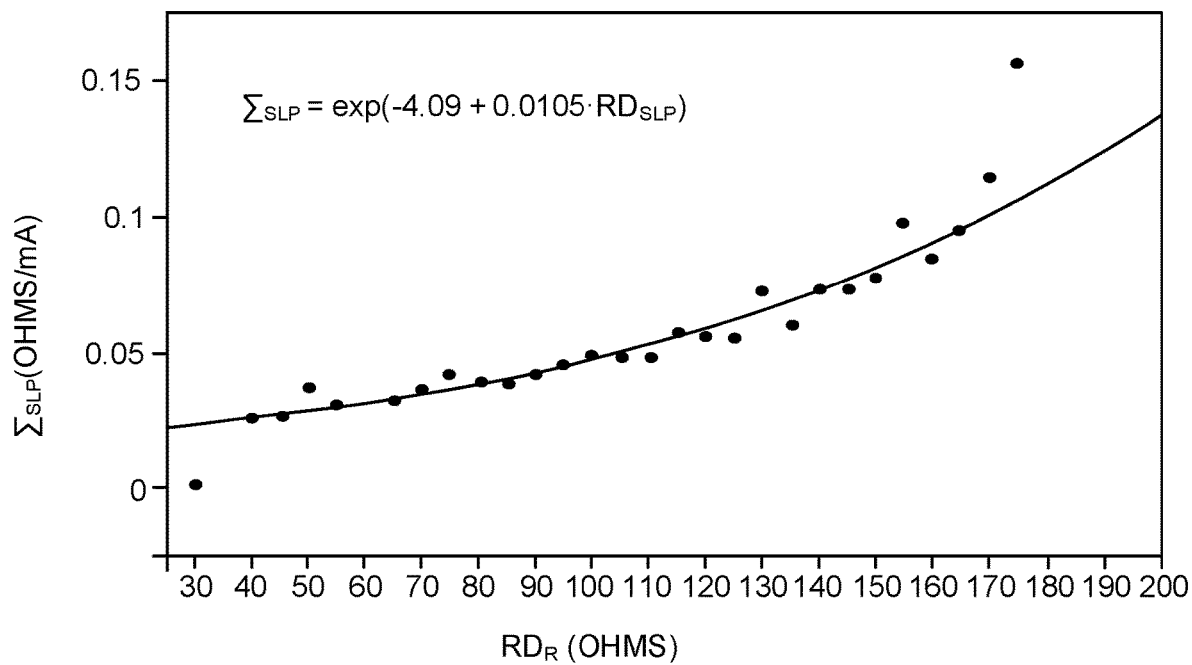
FIG. 13 is a plot of the standard deviation, $\Sigma_{SLP}$, versus $RD_R$, according to one embodiment.

FIG. 13 is a plot of the standard deviation, $\Sigma_{SLP}$, versus $RD_R$. The standard deviation, $\Sigma_{SLP}$, increases with the cabled TMR resistance, $RD_R$. The increase in deviation with TMR resistance is within a range from about 0.025 Ω/mA to about 0.12 Ω/mA. The analytical expression may be given by:

$$\Sigma_{SLP} = \exp(-4.09+0.0105\cdot RD_{SLP})$$

or $$\Sigma_{SLP} = \frac{1}{(41.7-0.196\cdot RD_{SLP})}.$$

FIGS. 12 and 13 show, for a constant current source, a single value for $RD_{SLP}$ and/or a single value for the deviation from the expected value is inadequate for accurately flagging damaged TMR elements. FIG. 13 demonstrates the limitations of a single upper and lower limit for $RD_{SLP}$ in detecting damaged TMR sensors. Various embodiments of the present invention describe a resistance dependent slope given by the polynomial fit to $RD_{SLP}(RD_R)$ and a resistance dependent error derived from the polynomial fit to $\Sigma_{SLP}(RD_R)$ which improve the accuracy of determining whether a TMR sensor is corroded.

The curve shown in FIG. 12 may represents a single, fixed and sufficiently high $I_{bias}$ for all TMRs with a constant current source and a variable bias voltage, $V_{bias}$, where $$V_{bias}=R_{TMR}\cdot I_{bias}. \quad (5)$$

The lower resistance (e.g., higher stripe height) TMRs have a lower bias voltage than the short stripe height parts. The resulting slope value is less sensitive to detecting damage. For a fixed bias current, varying the limits for $RD_{SLP}$ versus $R_{TMR}$ may yield a better indicator of the damaged parts.

In one embodiment, $RD_{SLP}$ data may be used to improve the accuracy of detecting outliers. The measured resistance value of an individual TMR may be compared to the expected value of a part with the same resistance value. In one approach, determining the expected value includes fitting the $RD_{SLP}$ versus $R_{TMR}$ data to a mathematical curve and comparing each individual measured $RD_{SLP}(R_{TMR})$ to the expected value generated by the fit. For example, $RD_{SLP\text{-}FIT}=a_0+a_1\cdot R_{TMR}+a_2\cdot R_{TMR}^2$.

For a cabled device, the cable resistance, $R_c$, is added to a total resistance of $R_{DUT}$ given by $R_{TMR}=R_{DUT}-R_c$.

TMR sensors with slope values outside the normal distribution have a higher chance of having magnetic and/or physical defect. Referring again to FIG. 12, a defective track (e.g., Defect T17) is shown. The resistance and amplitude for T17 are within a normal range of the remaining 32 tracks in the tape drive but the (signal-to-noise ratio) SNRa is degraded substantially.

Figure 14:
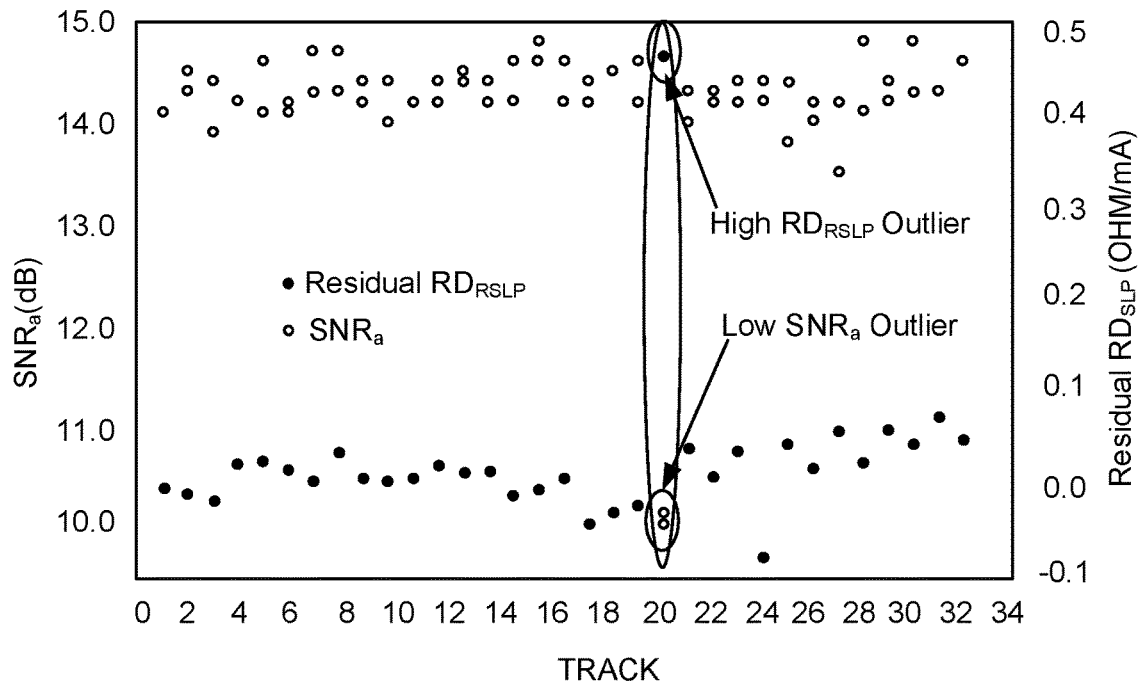
FIG. 14 is a plot of a drive SNRa and a residual $RD_{SLP}$ versus tracks in a tape head module in a drive, the tape head module comprising 33 TMRs, according to one embodiment.

FIG. 14 is a plot of a drive SNRa and a residual $RD_{SLP}$ versus tracks in a tape head module in a drive, the tape head module comprising 33 TMRs. The residual $RD_{SLP}$ is the difference between the actual value and the polynomial fit, $RD_{SLP\text{-}polyfit}$, from Equation 3:

$$\text{Residual } RD_{SLP}=RD_{SLP}-RD_{SLP\text{-}polyfit} \quad (7)$$

In other approaches, the residual $RD_{SLP}$ may interchangeably be the difference between the individual $RD_{SLP}$ and the module median $RD_{SLP}$:

$$\Delta RD_{SLP\text{-}n}=RD_{SLP\text{-}n}-\text{median}\{RD_{SLP}\}$$

where median$\{RD_{SLP}\}$ is the median $RD_{SLP}$ of the group of 33 TMRs in each drive and $RD_{SLP\text{-}polyfit}$ is given by Equation 3.

FIG. 14 shows Track 21 (e.g., T21) has a high positive $RD_{SLP\text{-}21}$ of about +0.5 Ω/mA, which represents an extreme outlier. The SNRa for T21 is about 5 dB below the rest of the tracks and the module median. The low SNRa for T21 results in the head failing a drive test.

Figure 15:
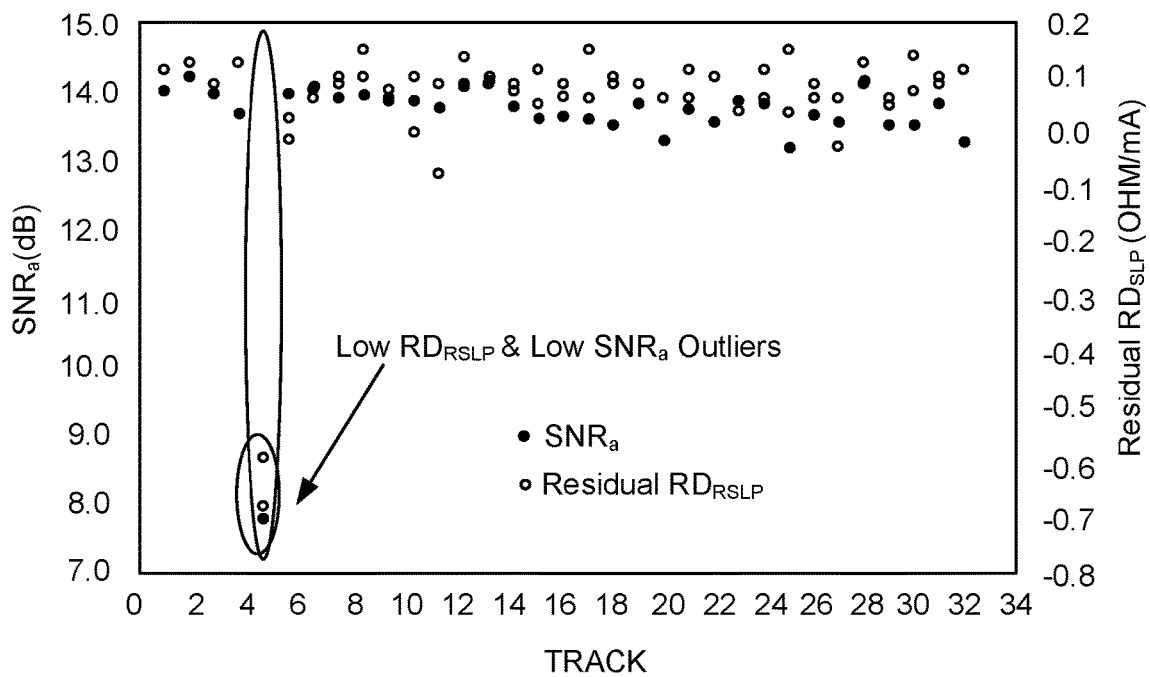
FIG. 15 is a plot of a drive SNRa and a residual $RD_{SLP}$ versus tracks in a tape head module in a drive, the tape head module comprising 33 TMRs, according to one embodiment.

FIG. 15 is a plot of a drive SNRa and a residual $RD_{SLP}$ versus tracks in a tape head module in a drive, the tape head module comprising 33 TMRs. FIG. 15 shows Track 5 (e.g., T5) with a negative residual $RD_{SLP\text{-}5}$ of about −0.7 Ω/mA, which represents an extreme outlier. The SNRa for T5 is about 5.5 dB below the rest of the tracks and the module median. The low SNRa for T5 results in the head failing a drive test.

Studies of a large population of drives showed that the failure rate was four times higher for drives having an $RD_{SLP}$ which is at least 2-sigma beyond the expected polynomial fit using the global standard deviation, $\Sigma_{SLP}$.

In another approach, the group (or module) standard deviation may be denoted by $\sigma_{SLP}$. Referring to FIGS. 14 and 15, the outlier tracks for Residual $RD_{SLP}$ are at least $8 \cdot \sigma_{SLP}$ from the 33 track module medians. The corresponding SNRa values are more than 5 dB from the module median values. The module standard deviation may be more sensitive than the global standard deviation where shifts in the median $RD_{SLP}$ are not included. The Module Residual $RD_{SLP}$ may be defined as the deviation from the module median $RD_{SLP}$ (ModuleMedian($RD_{SLP}$)) without calculating $RD_{SLP\text{-}polyfit}$:

$$\text{Module Residual } RD_{SLP} = RD_{SLP} - \text{ModuleMedian}(RD_{SLP}) \quad (8)$$

Each approach may yield the same value for $\sigma_{SLP}$.

Regarding FIGS. 14 and 15, the resistance values of the TMRs in the drives are nominal. The $R_{TMR}$ values are about 110Ω and a median $RD_{SLP}$ value of 0.5 Ω/mA. The $\Delta RD_{SLP\text{-}n}$ of the flagged tracks are extreme outliers from the expected $RD_{SLP}$ values for the TMRs in the drive even though the values are well within the minimum and maximum of all parts in the product (e.g., −2.0 to +2.0 Ω/mA in this exemplary drive). Various embodiments of the present inventions provide efficient operations for detecting outliers which may otherwise be erroneously overlooked.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method to detect a damaged tunneling magnetoresistance (TMR) sensor, the method comprising:
    applying current at at least two different current values to the TMR sensor;
    measuring a resistance, $R_{TMR}$, at each current value;
    measuring a slope in resistance vs. bias current, $RD_{SLP}$, using the measured resistances $R_{TMR}$ and the at least two different current values;
    calculating a $\Delta RD_{SLP}$ value as a difference between the $RD_{SLP}$ value and an expected value, $RD_{SLP\text{-}expected}$, for the TMR sensor, wherein $RD_{SLP\text{-}expected}$ is not the same value for all TMRs in a plurality of TMR sensors for a product;
    determining whether the $\Delta RD_{SLP}$ value is within a predefined range;
    in response to determining that the $\Delta RD_{SLP}$ value is outside the predefined range, outputting an indication that the TMR sensor fails; and
    in response to determining that the $\Delta RD_{SLP}$ value is within the predefined range, outputting an indication that the TMR sensor passes.

2. The computer-implemented method of claim 1, wherein the expected value, $RD_{SLP\text{-}expected}$, is determined by performing calculations on measurements for the plurality of TMR sensors, the calculations performed on the measurements for the plurality of TMR sensors whose resistance values at a fixed current or voltage, $R_{TMRo}$, span the range of resistance values for the plurality of TMR sensors for the product comprising:
    measuring a resistance, $R_{TMRo}$, and a slope in resistance vs. bias current, $RD_{SLP}$, for each of the plurality of tunneling magnetoresistance (TMR) sensors;
    creating a fit for $RD_{SLP}$ vs. $R_{TMRo}$ using the $RD_{SLP}$ and $R_{TMRo}$ values for the sensors; and
    determining the expected value, $RD_{SLP\text{-}expected}$, based on the fit for $RD_{SLP}$ vs. $R_{TMRo}$.

3. The computer-implemented method of claim 2, wherein creating the fit for $RD_{SLP}$ vs. $R_{TMRo}$ using the $RD_{SLP}$ and $R_{TMRo}$ values for the sensors includes creating a polynomial fit for $RD_{SLP}$ vs. $R_{TMRo}$ using the $RD_{SLP}$ and $R_{TMRo}$ values for the TMR sensors.

4. The computer-implemented method of claim 2, wherein creating the fit for $RD_{SLP}$ vs. $R_{TMR}$ using the $RD_{SLP}$ and $R_{TMRo}$ values for the sensors includes creating a median fit for $RD_{SLP}$ vs. $R_{TMR}$ in a narrow predefined range around each $R_{TMRo}$ value using measured $RD_{SLP}$ and $R_{TMRo}$ values from a look-up table for a set of TMR sensors whose resistance values, $R_{TMRo}$, span the range of resistance values for the plurality of TMR sensors for the product.

5. The computer-implemented method of claim 2, wherein creating the fit for $RD_{SLP}$ vs. $R_{TMR}$ using the $RD_{SLP}$ and $R_{TMRo}$ values for the sensors includes creating a standard deviation, $\Sigma RD_{SLP}$, of $RD_{SLP}$ vs. $R_{TMRo}$ using the $RD_{SLP}$ and $R_{TMRo}$ values for the sensors;
    calculating a $\Delta RD_{SLP}$ as a difference between the $RD_{SLP}$ value and an expected value, $RD_{SLP\text{-}expected}$, for each of the plurality of TMR sensors;
    determining whether the $\Delta RD_{SLP}$ value is within a second predefined range, wherein the second predefined range is based on $\Sigma RD_{SLP}$;
    in response to determining that the $\Delta RD_{SLP}$ value is outside the second predefined range, outputting an indication that the TMR sensor fails; and in response to determining that the $\Delta RD_{SLP}$ value is within the second predefined range, outputting an indication that the TMR sensor passes.

6. The computer-implemented method of claim 5, wherein an upper limit of the second predefined range is determined by $\Delta RD_{SLP} \leq N_{UL} \cdot \Sigma RD_{SLP}$, wherein a lower limit of the second predefined range is determined by $\Delta RD_{SLP} \geq -N_{LL} \cdot \Sigma RD_{SLP}$, wherein $N_{UL}$ and $N_{LL}$ are predefined positive real numbers.

7. The computer-implemented method of claim 6, wherein the predefined positive real numbers, $N_{UL}$ and $N_{LL}$, are about 4.

8. A computer program product to detect damaged tunneling magnetoresistance (TMR) sensors, the computer program product comprising a computer readable storage medium having program instructions embodied therewith, the program instructions executable by a computer to cause the computer to:
apply, by the computer, a first current, $I_1$, and a second current, $I_2$, to each of n TMR sensors located on a common substrate and built simultaneously;
measure, by the computer, for each of the TMR sensors, resistances $R_{TMR}(I_m)$ for m=1 and m=2;
calculate, by the computer, a slope in resistance vs. bias current, $RD_{SLPn}$, using the measured resistances $R_{TMR}(I_m)$ and the current values for $I_1$ and $I_2$, for each of the TMR sensors;
calculate, by the computer, the median $RD_{SLPn}$ for the TMR sensors located on the common substrate, $RD_{SLP\text{-}median}$;
calculate, by the computer, residuals of the nth element, $\Delta RD_{SLP\text{-}n}$, wherein $\Delta RD_{SLP\text{-}n} = RD_{SLPn} - RD_{SLP\text{-}median}$;
determine, by the computer, whether the $\Delta RD_{SLP\text{-}n}$ value is within a predefined range;
in response to determining that the $\Delta RD_{SLP\text{-}n}$ value is outside the predefined range, output, by the computer, an indication that the TMR sensor fails; and
in response to determining that the $\Delta RD_{SLP\text{-}n}$ value is within the predefined range, output, by the computer, an indication that the TMR sensor passes.

9. The computer program product of claim 8, wherein an upper limit of the predefined range is based on a positive predefined real number and a standard deviation of the $R_{TMR}$ values, wherein a lower limit of the predefined range is based on a negative predefined real number and the standard deviation of the $R_{TMR}$ values.

10. The computer program product of claim 8, wherein the predefined real number is about 4.

11. The computer program product of claim 8, comprising program instructions to cause the computer to:
exclude, by the computer, TMR sensors whose $RD_{SLP}$ values are determined to be outliers compared to the other TMR sensors on the common substrate using a nearest neighbor method which excludes parts based on the maximum deviation from the two nearest neighbors; and
for the nonexcluded TMR sensors, iteratively perform, by the computer, a process comprising the nearest neighbor method using only the two nearest neighbors which were not excluded on the previous pass until labeling of excluded sensors remains about constant for at least two consecutive iterations, wherein the nonexcluded TMR sensors are labeled as good, wherein the excluded sensors are labeled as bad.

12. The computer program product of claim 8, comprising program instructions to cause the computer to:

exclude, by the computer, TMR sensors whose $RD_{SLP}$ values are determined to be outliers compared to the other TMR sensors on the common substrate by using a nearest neighbor method which excludes parts based on the maximum deviation from the two nearest neighbors; and
for the nonexcluded TMR sensors, iteratively perform, by the computer, the following sequence until labeling of the nonexcluded TMR sensors remains about constant for at least two consecutive iterations:
fit, by the computer, the nonexcluded TMR sensors to a polynomial of $RD_{SLP}$ vs. TMR track, m, wherein m is sequential from 1 to the number of TMR sensors located on the common substrate, and the polynomial fit to $RD_{SLP}$ vs. m for track m is $RD_{SLP\text{-}expected}$ for track m, $RD_{SLP\text{-}expected\text{-}m}$;
compare, by the computer, the measured value of $RD_{SLP}$ for each sensor, $RD_{SLP\text{-}m}$, to a $RD_{SLP\text{-}expected\text{-}m}$ value from the polynomial fit to determine whether the $RD_{SLP\text{-}m}$ value of the sensor is within a second predefined range;
in response to determining that the $RD_{SLP\text{-}m}$ value of the sensor is within the second predefined range, label, by the computer, the sensor as good; and
in response to determining that the $RD_{SLP\text{-}m}$ value of the sensor is outside the second predefined range, label, by the computer, the sensor as bad.

13. A computer-implemented method to use a current-based tester as a pseudo voltage-based tester, comprising:
setting a target voltage, $V_{target}$, for a tunneling magnetoresistance (TMR) sensor using a current-based tester;
selecting a current value, $I_{bias}$, wherein $I_{bias} = V_{target}/R_{TMR\text{-}expected}$, wherein $R_{TMR\text{-}expected}$ is an expected resistance for the TMR sensor,
applying a current at the value, $I_{bias}$, to the TMR sensor, measuring a resistance across the TMR sensor, $R_{TMR}$,
calculating a bias voltage, $V_{bias}$, using the current value, $I_{bias}$, and the measured resistance, wherein $V_{bias} = I_{bias} \cdot R_{TMR}$, and
comparing the calculated bias voltage to the target voltage; and
storing the current value, $I_{bias}$, in response to determining that the bias voltage is within a predefined range of the target voltage.

14. The computer-implemented method of claim 13, comprising repeating the sequence iteratively using different values for $R_{TMR\_expected}$ to calculate the $I_{bias}$ to achieve the target voltage, $V_{target}$, until a bias voltage within the predefined range of the target voltage is achieved.

15. The computer-implemented method of claim 13, wherein an initial value of $R_{TMR\_expected}$ is the highest possible value of $R_{TMR}$ for the TMR sensor used.

16. The computer-implemented method of claim 13, wherein the values of $R_{TMR\text{-}expected}$ for all iterations other than the initial iteration are the values of $R_{TMR}$ from the previous iteration.

17. The computer-implemented method of claim 13, wherein the target voltage, $V_{target}$, is less than a maximum allowed voltage for safe operation of the TMRs used.

18. The computer-implemented method of claim 13, wherein the target voltage, $V_{target}$, is set based on target voltage values in a first text file, wherein the current value, $I_{bias}$, is stored in a second text file, wherein the second text file is used during reading operations.

* * * * *